(12) United States Patent
Baek et al.

(10) Patent No.: US 7,883,942 B2
(45) Date of Patent: Feb. 8, 2011

(54) CONTACT STRUCTURE OF SEMICONDUCTOR DEVICE, MANUFACTURING METHOD THEREOF, THIN FILM TRANSISTOR ARRAY PANEL INCLUDING CONTACT STRUCTURE, AND MANUFACTURING METHOD THEREOF

(75) Inventors: Bum-Gee Baek, Suwon (KR);
Kwon-Young Choi, Seoul (KR);
Young-Joon Rhee, Seoul (KR);
Bong-Joo Kang, Bunsan (KR);
Seung-Taek Lim, Seoul (KR);
Hyang-Shik Kong, Suwon (KR);
Won-Joo Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 661 days.

(21) Appl. No.: 11/875,199

(22) Filed: Oct. 19, 2007

(65) Prior Publication Data

US 2008/0044996 A1    Feb. 21, 2008

Related U.S. Application Data

(62) Division of application No. 10/653,556, filed on Sep. 2, 2003, now Pat. No. 7,294,855.

(30) Foreign Application Priority Data

Sep. 2, 2002    (KR) ..................... 10-2002-0052509
Sep. 4, 2002    (KR) ..................... 10-2002-0053220

(51) Int. Cl.
*H01L 21/00* (2006.01)
(52) U.S. Cl. .................. 438/149; 257/E29.151
(58) Field of Classification Search ......... 438/149–167; 257/E29.151
See application file for complete search history.

(56) References Cited

U.S. PATENT DOCUMENTS 6,022,753 A    2/2000   Park et al.

(Continued)

FOREIGN PATENT DOCUMENTS

CN    1343900    4/2002

(Continued)

OTHER PUBLICATIONS

Chinese Office Action and English Translation for Chinese Patent Application : 03164805.3; Dated: Mar. 22, 2007.

(Continued)

*Primary Examiner*—Brook Kebede
(74) *Attorney, Agent, or Firm*—Cantor Colburn LLP

(57) ABSTRACT

Gate lines are formed on a substrate. A gate insulating layer, an intrinsic a-Si layer, an extrinsic a-Si layer, a lower film of Cr and an upper film of Al containing metal are sequentially deposited. A photoresist having thicker first portions on wire areas and thinner second portions on channel areas is formed on the upper film. The upper film on remaining areas are wet-etched, and the lower film and the a-Si layers on the remaining areas are dry-etched along with the second portions of the photoresist. The upper film, the lower film, and the extrinsic a-Si layer on the channel areas are removed. The removal of the upper film and the lower film on the channel areas are performed by wet etching, and the first portions of the photoresist are removed after the removal of the upper film on the channel areas.

13 Claims, 47 Drawing Sheets

U.S. PATENT DOCUMENTS

| | | |
|---|---|---|
| 6,207,970 B1 | 3/2001 | Kim |
| 6,218,221 B1 | 4/2001 | Sah |
| 6,338,989 B1 | 1/2002 | Ahn et al. |
| 6,414,730 B1 | 7/2002 | Akamatsu et al. |
| 6,424,399 B1 | 7/2002 | Shimada et al. |
| 6,630,688 B2 * | 10/2003 | Kong et al. .................. 257/72 |
| 6,861,368 B2 * | 3/2005 | Chae ......................... 438/738 |
| 2001/0019126 A1 | 9/2001 | Kim |
| 2001/0019129 A1 | 9/2001 | You |
| 2002/0041347 A1 | 4/2002 | Lee et al. |
| 2002/0052058 A1 | 5/2002 | Tseng |
| 2002/0053701 A1 | 5/2002 | Kong et al. |
| 2002/0074549 A1 | 6/2002 | Park et al. |
| 2004/0238825 A1 | 12/2004 | Lim et al. |

FOREIGN PATENT DOCUMENTS

| | | |
|---|---|---|
| JP | 4253342 | 9/1992 |
| JP | 11-074537 A | 3/1999 |
| JP | 11133452 | 5/1999 |
| JP | 2000-164886 A | 6/2000 |
| JP | 2000-199917 A | 7/2000 |
| JP | 2000221542 | 8/2000 |
| JP | 2000267595 | 9/2000 |
| JP | 2001-066639 A | 3/2001 |
| JP | 2001-332735 A | 11/2001 |
| KR | 100307385 | 8/2001 |
| KR | 100316072 | 11/2001 |
| KR | 1020020037845 | 5/2002 |
| KR | 20020065053 | 8/2002 |

OTHER PUBLICATIONS

European Search Report for Application No. EP03019534; Completion date Feb. 1, 2006.

* cited by examiner

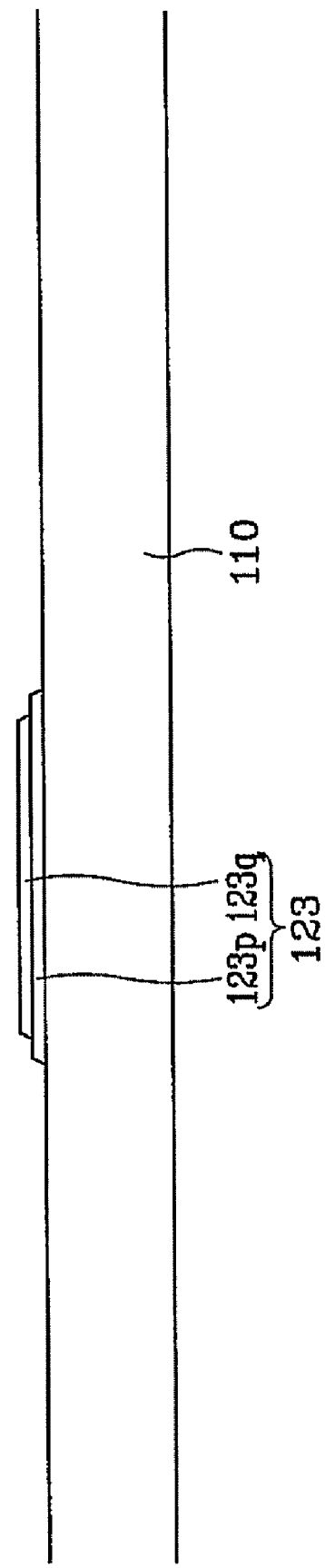

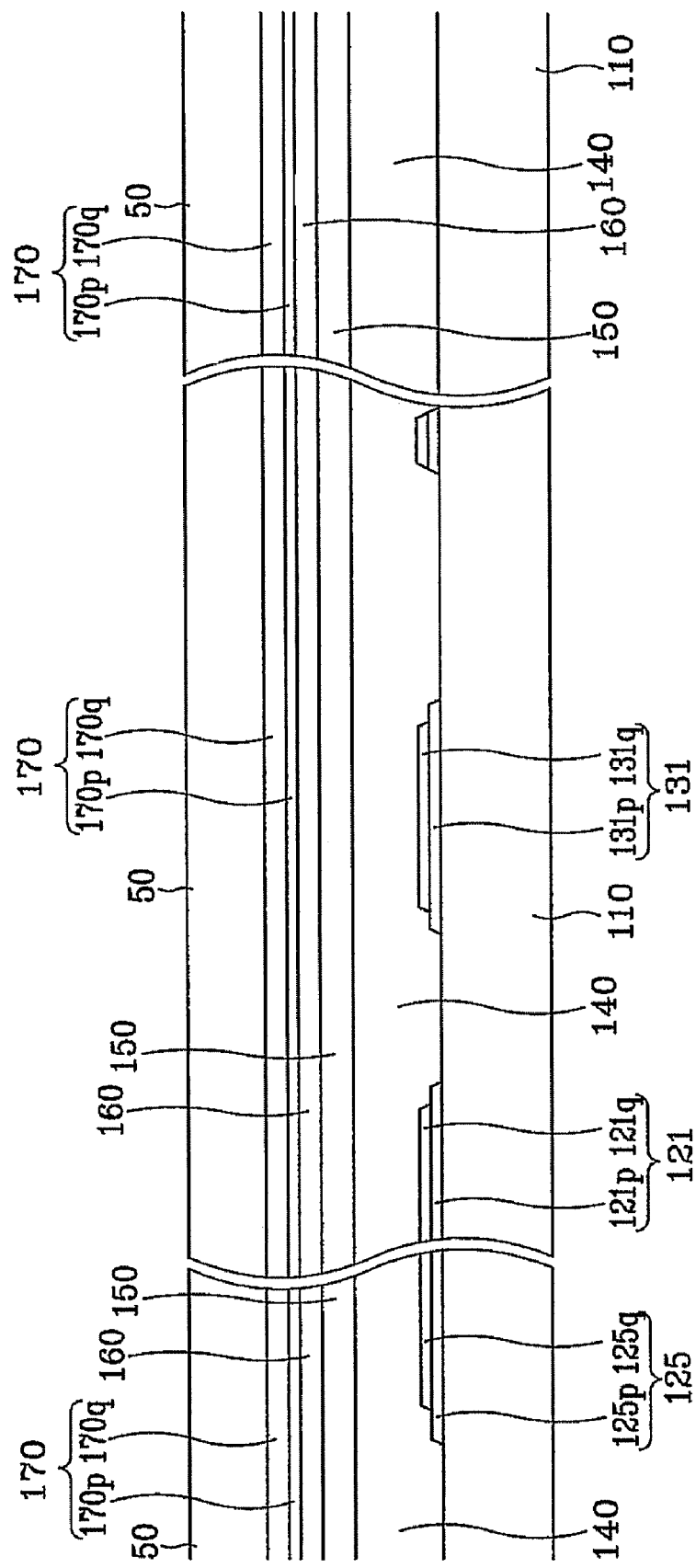

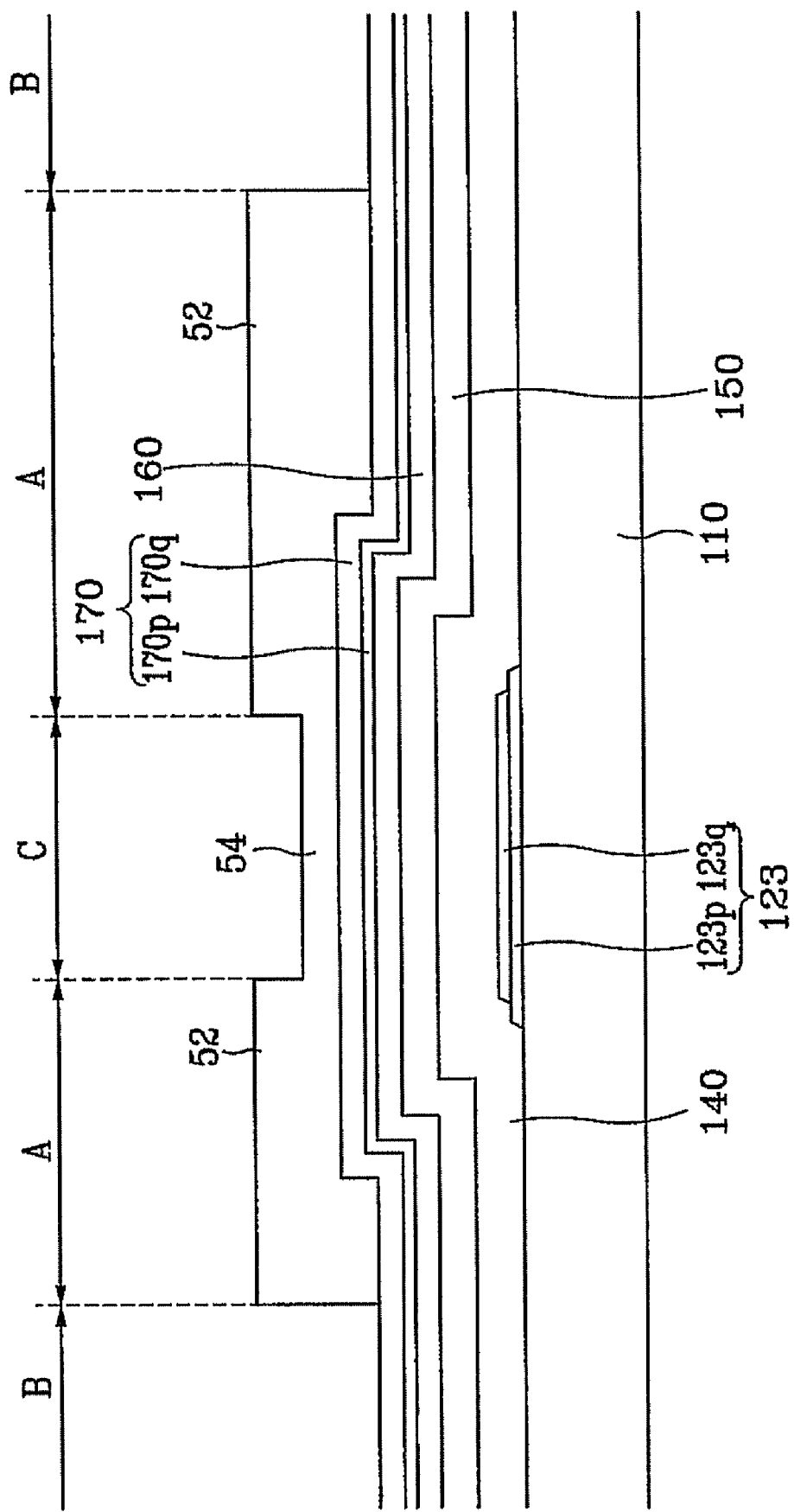

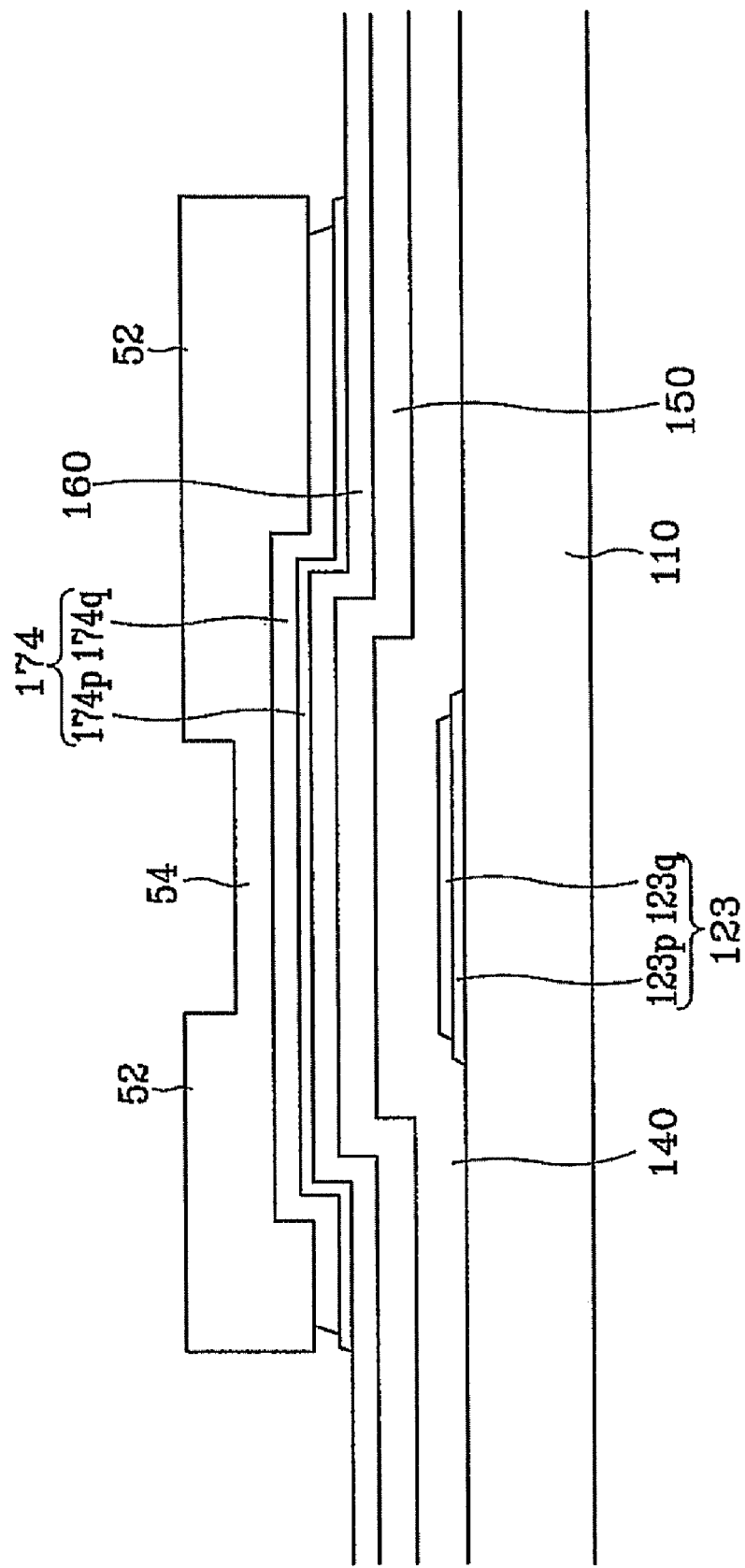

CONTACT STRUCTURE OF SEMICONDUCTOR DEVICE, MANUFACTURING METHOD THEREOF, THIN FILM TRANSISTOR ARRAY PANEL INCLUDING CONTACT STRUCTURE, AND MANUFACTURING METHOD THEREOF

CROSS REFERENCE TO RELATED APPLICATIONS

This application is a divisional application of U.S. application Ser. No. 10/653,556 filed Sep. 2, 2003, which claims priority to and the benefit of Korean Patent Application No. 2002-0053220, filed on Sep. 4, 2002, all of which are incorporated by reference herein in their entirety.

BACKGROUND OF THE INVENTION (a) Field of the Invention

The present invention relates to a contact structure of a semiconductor device, a manufacturing method thereof, a thin film transistor array panel including a contact structure, and a manufacturing method thereof.

(b) Description of the Related Art

A wire for a semiconductor device is generally made of a metal having low resistivity such as Al containing metal such as Al and Al alloy for signal transmission with minimized signal delay. However, Al containing metal has poor physical and chemical characteristics such that its contact with other materials is easily corroded to deteriorate the characteristics of the semiconductor device.

In particular, a liquid crystal display (LCD) reinforces contacts of a wire with transparent conductive indium tin oxide (ITO) used for pixel electrodes, which corrodes the wire if made of Al containing metal. Although indium zinc oxide (IZO), which does not erode Al containing metal, is suggested as a substitute for ITO, there is a problem of high contact resistance between IZO and wires. It is also suggested that an additional conductor having good contact characteristic be interposed between the wire and ITO or IZO. However, the additional conductor requires an additional photo etching process to increase the complexity of the manufacturing process and the production cost.

A panel for an LCD usually has a layered structure including several conductive layers and insulating layers and several photolithography steps are required for manufacturing the LCD panel. Since the production cost increase as the number of the photolithography steps increase, it is preferable to reduce the number of the photolithography steps.

In the meantime, a gross test for examining the disconnection of the wires and the failure of thin film transistors (TFTs) formed on the LCD panel is performed by contacting probe tips of a tester with contacts of the wires and applying test signals to the contacts.

However, since the probe tips may not be firmly fixed at one point on the contacts and may slide on the surfaces of the contacts such that they scratch the contacts to be damaged and are coated with remnants. Since ITO and IZO used for the reinforcement of the wires have high resistivity, their remnants coated on the probe tips may increase the contact resistance of the tips to decrease the reliability of the gross test.

SUMMARY OF THE INVENTION

A contact structure of a semiconductor device is provided, which includes: a dry-etchable lower conductive film; an upper conductive film formed on the lower film and including Al or Al alloy, the upper film having edges located on the lower film; an insulator having a contact hole exposing at least a portion of the lower film; and an IZO layer formed on the insulator and contacting the lower film through the contact hole.

The contact hole preferably exposes at least one edge of the lower film, and the distance between the edges of the lower film and the edges of the upper film is substantially uniform.

The lower film preferably includes Cr.

A method of forming a contact structure of a semiconductor device is provided, which includes: forming a lower conductive film; forming an upper conductive film on the lower film, the upper film including Al or Al alloy; forming a photoresist on the upper film; wet-etching the upper film using the photoresist as an etch mask to produce undercut under the photoresist; dry-etching the lower film using the photoresist as an etch mask; forming an insulating layer having a contact hole exposing at least a portion of the lower film; and forming an IZO layer on the insulating layer, the IZO layer contacting the lower film through the contact hole.

The contact hole preferably exposes at least one edge of the lower film, and the lower film preferably includes Cr.

A thin film transistor array panel is provided, which includes: a gate conductive layer formed on an insulating substrate; a gate insulating layer on the conductive layer; a semiconductor layer on the gate insulating layer; a data conductive layer formed at least in part on the semiconductor layer; a passivation layer formed on the data conductive layer; and an IZO conductive layer formed on the passivation layer, wherein at least one of the gate conductive layer and the data conductive layer includes a dry-etchable lower film and an upper film formed on the lower film, the upper film including Al or Al alloy and having edges located on the lower film, and the IZO conductive layer contacts the lower film.

The distance between edges of the lower film and edges of the upper film adjacent thereto is substantially uniform.

Preferably, the lower film includes Cr, and the lower film has a thickness equal to or less than about 500 Å.

It is preferable that the data conductive layer includes a data line and a drain electrode separated from each other, and the IZO conductive layer includes a pixel electrode contacting the drain electrode, a gate contact assistant contacting a portion of the gate conductive layer, and a data contact assistant contacting a portion of the data line.

The semiconductor layer may have substantially the same planar shape as the data conductive layer except for a portion located between the data line and the drain electrode.

The passivation layer may contact the semiconductor layer.

A method of manufacturing a thin film transistor array panel is provided, which includes: forming a gate conductive layer on an insulating substrate; forming a gate insulating layer; forming a semiconductor layer; forming a data conductive layer including a data line and a drain electrode; forming a protective layer having a contact hole on at least a portion of the gate conductive layer and the data conductive layer; and forming an IZO conductive layer connected to t least a portion of the gate conductive layer and the data conductive layer through the contact hole, wherein the at least a portion of the gate conductive layer and the data conductive layer includes a dry-etchable lower film and an upper film made of Al or Al alloy.

The formation of the at least a portion of the gate conductive layer and the data conductive layer preferably includes: sequentially depositing the lower film and the upper film; forming a photoresist on the upper film; wet-etching the upper film; and dry-etching the lower film.

Preferably, the lower film includes Cr, and the lower film has a thickness equal to or less than about 500 Å.

The semiconductor layer preferably includes an intrinsic film and an extrinsic film.

According to an embodiment of the present invention, the formation of the data conductive layer and the semiconductor layer is performed by etching with a single photoresist, and the photoresist includes a first portion with a first thickness located on a wire area, a second portion with a second thickness smaller than the first thickness located on a channel area, and a third portion thinner than the second portion and located on a remaining area.

The photoresist is formed by using a single mask.

The formation of the gate insulating layer, the intrinsic film, the extrinsic film, and the data conductive layer preferably includes: sequentially depositing the gate insulating layer, an intrinsic amorphous silicon film, an extrinsic amorphous silicon film, a lower film and a upper film, which include first portions on the wire area, second portions on the channel area, and third portions on the remaining area; coating a photoresist on the conductor layer; exposing the photoresist to light through a mask; developing the photoresist; forming the data conductive layer, the extrinsic film, and the intrinsic film by removing the third portions of the upper film, the lower film, the extrinsic amorphous silicon film, and the intrinsic amorphous silicon film, and the second portions of the upper film, the lower film and the extrinsic amorphous silicon film; and removing the photoresist pattern.

According to an embodiment of the present invention, the formation of the data conductive layer, the extrinsic film, and the intrinsic film includes: performing wet etching to remove the third portion of the upper film and to expose the third portion of the lower film; performing dry etching to remove the third portion of the lower film and to expose the third portion of the extrinsic amorphous silicon film; performing dry etching to remove the third portions of the extrinsic amorphous silicon film and the intrinsic amorphous silicon film and the second portion of the photoresist such that the second portion of the upper film is exposed and the intrinsic film is completed from the intrinsic amorphous silicon film; removing the second portion of the upper film; removing the second portion of the lower film such that the data conductive layer is completed; removing the second portion of the extrinsic amorphous silicon film such that the extrinsic film is completed; and removing the first portion of the photoresist.

The removal of the first portion of the photoresist is preferably performed between the removal of the second portion of the upper film and the removal of the second portion of the lower film.

A thin film transistor array panel is provided, which includes: a gate line formed on an insulating substrate; a gate insulating layer on the gate line; a semiconductor layer on the gate insulating layer; a data line formed at least in part on the semiconductor layer; a drain electrode formed at least in part on the semiconductor layer and spaced apart from the data line; a passivation layer formed on the semiconductor layer and having a first contact hole exposing the drain electrode, a second contact hole exposing a portion of the gate line, and a third contact hole exposing a portion of the data line; a pixel electrode connected to the drain electrode through the first contact hole; a gate contact assistant connected to the gate line through the second contact hole; and a data contact assistant connected to the data line through the third contact hole and having unevenness.

Preferably, the data line includes a Cr film and an Al film on the Cr film, and the data contact assistant includes IZO.

The thin film transistor array panel may further include an ohmic contact layer interposed between the semiconductor layer and the data line and the drain electrode and having substantially the same planar shape as the data line and the drain electrode, and the semiconductor layer has substantially the same planar shape as the ohmic contact layer except for a portion located between the data line and the drain electrode.

A thin film transistor array panel is provided, which includes: an insulating substrate; a gate electrode formed on the substrate; a gate insulating layer on the gate electrode; a semiconductor layer on the gate insulating layer opposite the gate electrode; a data line formed at least in part on the semiconductor layer and having a trench; a drain electrode formed at least in part on the semiconductor layer and spaced apart from the data line; a passivation layer formed on the semiconductor layer and having a first contact hole exposing the drain electrode and a second contact hole exposing the trench of the data line; a pixel electrode connected to the drain electrode through the first contact hole; and a data contact assistant connected to the data line through the second contact hole and extending along the trench of the data line.

Preferably, the data line includes a Cr film and an Al film on the Cr film, and the data contact assistant includes IZO.

The trench is provided only at the Al film, or the trench exposes the substrate.

BRIEF DESCRIPTION OF THE DRAWINGS

The above and other advantages of the present invention will become more apparent by describing preferred embodiments thereof in detail with reference to the accompanying drawings in which:

FIGS. 12B and 12C are sectional views of the TFT array panel shown in FIG. 12A taken along the lines XIIB-XIIB' and XIIC-XIIC', respectively;

FIGS. 13A and 13B are sectional views of the TFT array panel shown in FIG. 12A taken along the lines XIIB-XIIB' and XIIC-XIIC', respectively, and illustrate the step following the step shown in FIGS. 12B and 12C;

FIGS. 14B and 14C are sectional views of the TFT array panel shown in FIG. 14A taken along the lines XIVB-XIVB' and XIVC-XIVC', respectively;

FIGS. 15A, 16A and 17A, and FIGS. 15B, 16B and 17B are respective sectional views of the TFT array panel shown in FIG. 14A taken along the lines XIVB-XIVB' and XIVC-XIVC', respectively, and illustrate the steps following the step shown in FIGS. 14B and 14C;

DETAILED DESCRIPTION OF PREFERRED EMBODIMENTS

Figure 1A:
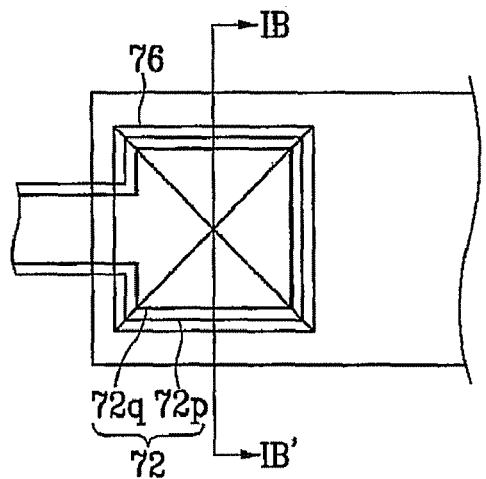
FIG. 1A is a layout view of a contact of a semiconductor device according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, contact structures of semiconductor devices, manufacturing methods thereof, TFT array panels including contact structures and manufacturing methods thereof according to embodiments of the present invention will be described with reference to the accompanying drawings.

Figure 1B:
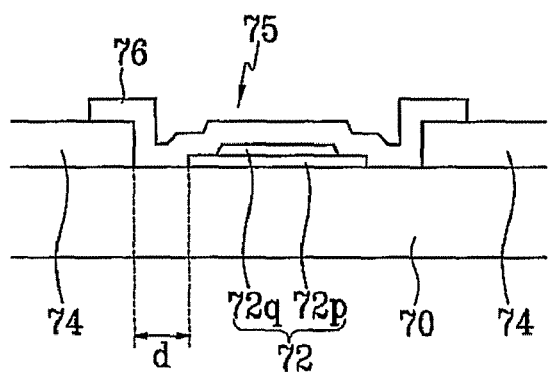
FIG. 1B is a sectional view of the contact shown in FIG. 1A taken along the line IA-IA'.
Figure 1C:
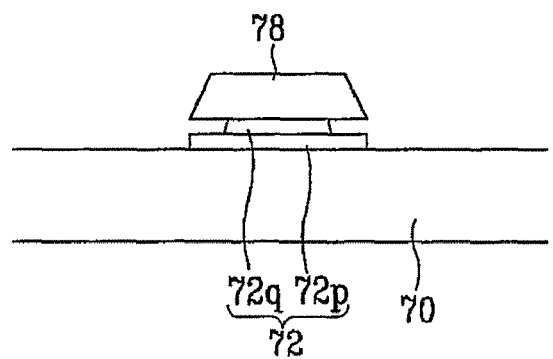
FIG. 1C is a sectional view of the contact structure shown in FIGS. 1A and 1B in an intermediate step in a manufacturing method thereof according to an embodiment of the present invention.

FIG. 1A is a layout view of a contact of a semiconductor device according to an embodiment of the present invention, FIG. 1B is a sectional view of the contact shown in FIG. 1A taken along the line IA-IA', and FIG. 1C is a sectional view of the contact structure shown in FIGS. 1A and 1B in an intermediate step in a manufacturing method thereof according to an embodiment of the present invention.

Aluminum containing metal such as Al and Al alloy is suitable for a signal wire of a semiconductor device such as a liquid crystal display since the Al containing metal has low resistivity equal to or less than about 15 μΩ·cm, which can minimize signal delay. The wire needs to be connected to other metal layer for signal communication, and the contact resistance between the wire and the other metal layer is preferably as small as possible.

A wire 72 according to an embodiment of the present invention, which is formed on a substrate 70, includes a lower film 72p and an upper film 72q as shown in FIGS. 1A and 1B. The lower film 72p is preferably made of a conductive material such as Cr, Mo and Mo ally that are dry-etchable and have low contact resistance with indium zinc oxide (IZO), while the upper film 72q is preferably made of Al or Al alloy having low resistivity. The lower film 72p is wider than the upper film 72q such that edges of the lower film 72p are located outside edges of the upper film 72q.

An insulating layer 74 is formed on the wire 72, and has a contact hole 75 exposing the wire 72, particularly the lower film 72p at least in part.

A conductor 76 preferably made of IZO is formed on the insulating layer 74, and contacts the lower film 72p of the wire 72 through the contact hole 75.

The contact hole 75 preferably exposes an edge of the lower film 72p, and the distance between the exposed edge of the lower film 72p and an edge of the contact hole 75 adjacent thereto is equal to or less than a predetermined value, e.g., about two microns. It is because the disconnection of the conductor 76 may be generated due to the height difference at the contact hole 75 and undercut at the wire 72 if the distance is larger than the predetermined value.

In a method of forming the contact structure shown in FIGS. 1A and 1B according to an embodiment of the present invention, a lower film 72p made of Cr, Mo or Mo alloy and an upper film 72q made of Al or Al alloy are sequentially deposited and a photoresist 78 is formed on the upper film 72q as shown in FIG. 1C. The upper film 72q is wet-etched with an etchant using the photoresist 78 as an etch mask. The isotropic chemical wet etching undercuts the photoresist 78. Subsequently, the lower film 72p is dry-etched using the photoresist as an etch mask. The anisotropic dry etching produces almost vertical etch profiles such that the edges of the lower film 72p nearly correspond to those of the photoresist 78. Accordingly, the edges of the lower film 72p lies outside the edges of the upper film 72q, and the distance between the edges of the lower film 72p and those of the upper film 72q is uniform.

When Cr is used as a material for the lower film 72p, a preferred thickness of the lower film 72p for dry etching is equal to or less than about 500 Å and, more preferably, is about 300 Å.

When an additional dry-etchable film (not shown) is located under the lower film 72p, the lower film 72p and the additional film are sequentially dry etched to simplify the manufacturing process, particularly when the two films are etchable under the same etching condition. An example of such an additional film is a semiconductor film preferably including silicon.

After removing the photoresist 78, an insulating layer 74 is deposited such that it covers the wire 72. The insulating layer 74 is photo-etched to form a contact hole 75 exposing a portion of the wire 72. The contact hole 75 exposes a portion of the lower film 72p of the wire 72, and preferably includes an edge of the lower film 72p. An IZO layer is deposited and patterned to form a conductor 76 contacting the wire 72, particularly the lower film 72p of the wire 72 through the contact hole 75.

According to another embodiment of the present invention, the lateral etch profiles of the lower film 72p and the upper film 72q are regulated by differentiating their etching conditions such as etching time while using the same type of etching. For instance, the etching time for the upper film 72q is longer than that of the lower film 72p such that the lower film 72p is exposed outside the upper film 72q.

The above-described contact structure and manufacturing method thereof is adaptable to an LCD and a manufacturing method thereof.

Figure 2:
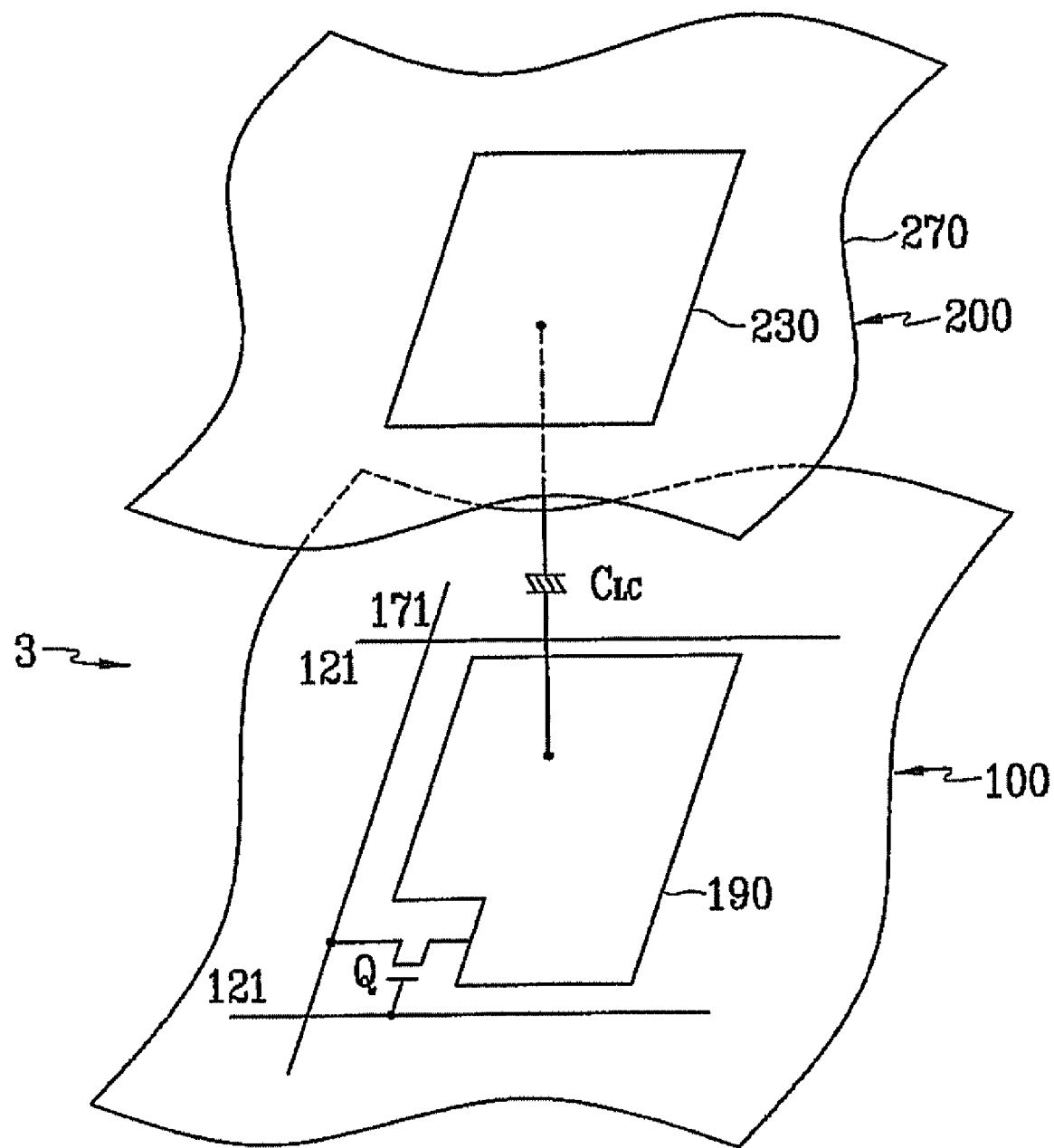
FIG. 2 is a schematic diagram of an LCD according to an embodiment of the present invention.

FIG. 2 is a schematic diagram of an LCD according to an embodiment of the present invention.

Referring to FIG. 2, an LCD includes a pair of panels 100 and 200 and a liquid crystal layer 3 interposed therebetween. One panel 100 is called a "TFT array panel" including a plurality of TFTs Q, a plurality of pixel electrodes 190, a plurality of gate lines 121, and a plurality of data lines 171. Each pixel electrode 190 is connected to a pair of the gate lines 121 and the data lines 171 via at least one of the TFTs Q. The other panel 200 includes a common electrode 270 generating electric field in cooperation with the pixel electrodes 190, and a plurality of color filters 230 for color display. The pixel electrode 190 and the common electrode 270 act as a liquid crystal capacitor $C_{LC}$ with liquid crystal dielectric. The common electrode 270 may be provided on the TFT array panel 100, and then the pixel electrodes 190 and the common electrode 270 have shapes of bars or stripes.

A TFT array panel for an LCD including a contact structure will be described in detail with reference to FIGS. 3 and 4.

Figure 3:
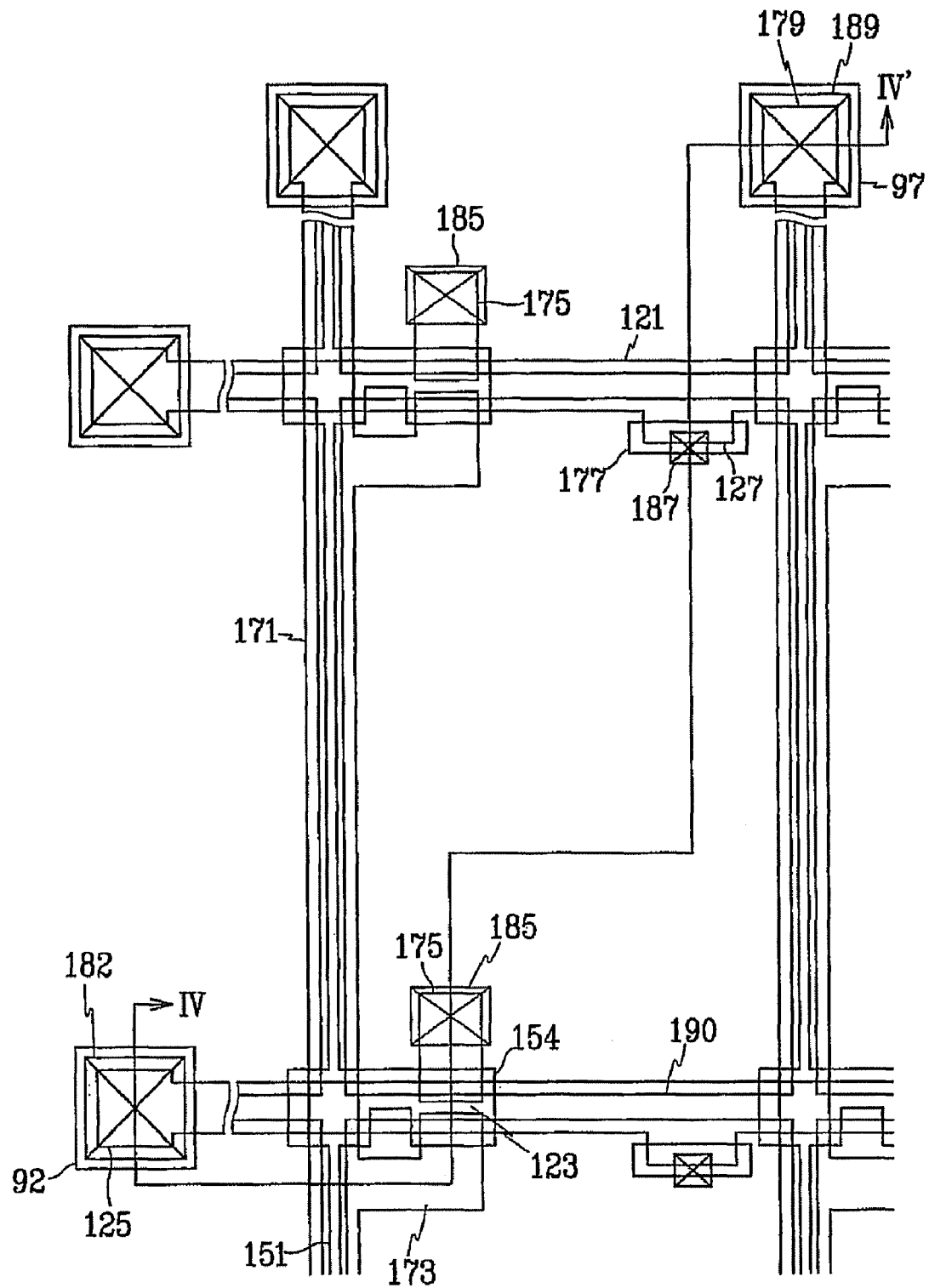
FIG. 3 is a layout view of an exemplary TFT array panel for an LCD according to an embodiment of the present invention.
Figure 4:
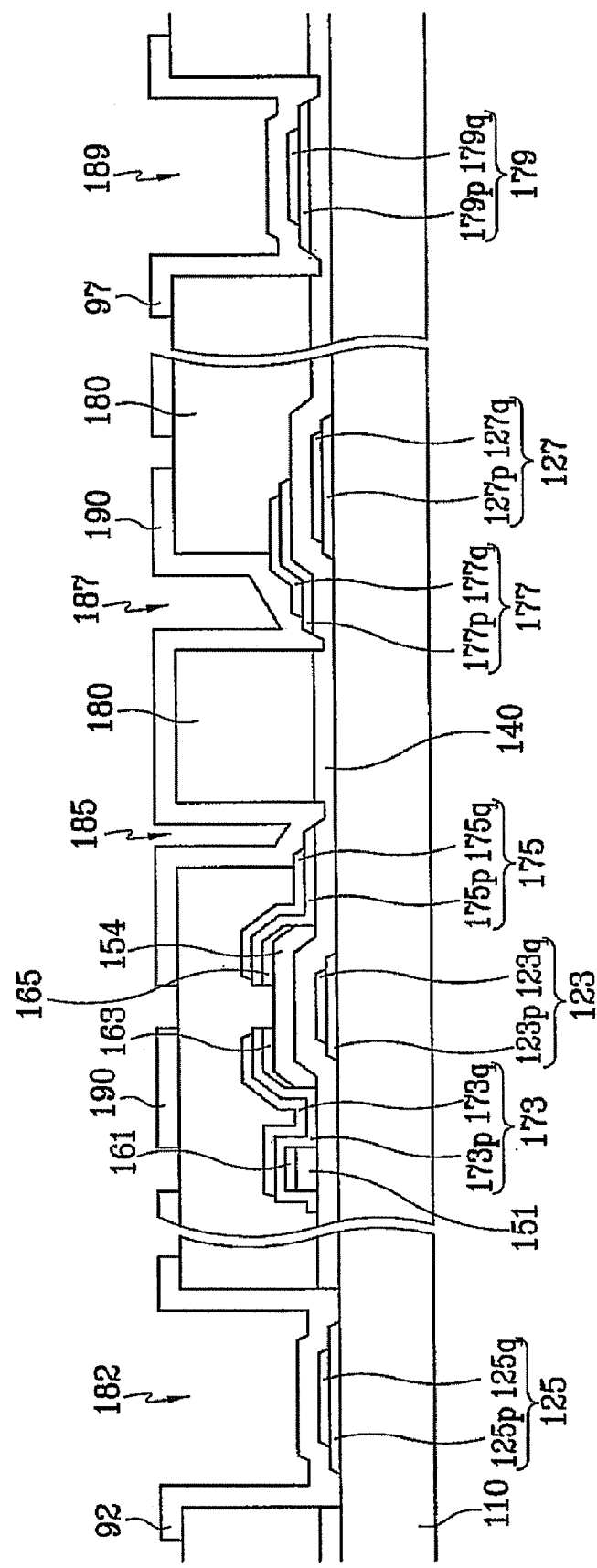
FIG. 4 is a sectional view of the TFT array panel shown in FIG. 3 taken along the line IV-IV'.

FIG. 3 is a layout view of an exemplary TFT array panel for an LCD according to an embodiment of the present invention, and FIG. 4 is a sectional view of the TFT array panel shown in FIG. 3 taken along the line IV-IV'.

A plurality of gate lines 121 for transmitting gate signals are formed on an insulating substrate 110. Each gate line 121 extends substantially in a transverse direction and a plurality of portions of each gate line 121 form a plurality of gate electrodes 123. Each gate line 121 includes a plurality of expansions 127 protruding downward.

The gate lines 121 include two films having different physical characteristics, a lower film 121p and an upper film 121q. The upper film 121q is preferably made of low resistivity metal including Al containing metal such as Al and Al alloy for reducing signal delay or voltage drop in the gate lines 121. On the other hand, the lower film 121p is preferably made of material such as Cr, Mo and Mo alloy, which is dry-etchable and has good contact characteristics with other materials such as IZO. A good exemplary combination of the lower film material and the upper film material is Cr and Al—Nd alloy.

The edges of the lower film 121p are located inside the edges of the upper film 121q and the distance between the edges of the lower film 121p and the edges of the upper film 121q is uniform such that the top surface of the lower film 121p is exposed and the lateral sides of the upper film 121q and the lower film 121p form stairs. In addition, the lateral sides of the upper film 121q and the lower film 121p are tapered, and the inclination angle of the lateral sides with respect to a surface of the substrate 110 ranges about 30-80 degrees.

A gate insulating layer 140 preferably made of silicon nitride (SiNx) is formed on the gate lines 121.

A plurality of semiconductor stripes 151 preferably made of hydrogenated amorphous silicon (abbreviated to "a-Si") are formed on the gate insulating layer 140. Each semiconductor stripe 151 extends substantially in a longitudinal direction and has a plurality of projections 154 branched out toward the gate electrodes 123. The width of each semiconductor stripe 151 becomes large near the gate lines 121 such that the semiconductor stripe 151 covers large areas of the gate lines 121.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are tapered, and the inclination angles thereof are preferably in a range between about 30-80 degrees.

A plurality of data lines 171, a plurality of drain electrodes 175, and a plurality of storage capacitor conductors 177 are formed on the ohmic contacts 161 and 165 and the gate insulating layer 140.

The data lines 171 for transmitting data voltages extend substantially in the longitudinal direction and intersect the gate lines 121. A plurality of branches of each data line 171, which project toward the drain electrodes 175, form a plurality of source electrodes 173. Each pair of the source electrodes 173 and the drain electrodes 175 are separated from each other and opposite each other with respect to a gate electrode 123. A gate electrode 123, a source electrode 173, and a drain electrode 175 along with an projection 154 of a semiconductor stripe 151 form a TFT having a channel formed in the projection 154 disposed between the source electrode 173 and the drain electrode 175.

The storage capacitor conductors 177 overlap the expansions 127 of the gate lines 121.

The data lines 171, the drain electrodes 175, and the storage capacitor conductors 177 also include a lower film 171p, 175p and 177p preferably made of Mo, Mo alloy or Cr and an upper film 171q, 175q and 177q located thereon and preferably made of Al containing metal.

Like the gate lines 121, the lower film 171p, 175p and 177p and the upper film 171q, 175q and 177q of the data lines 171, the drain electrodes 175, and the storage capacitor conductors 177 have tapered lateral sides, and the inclination angles thereof range about 30-80 degrees. The edges of the lower film 171p, 175p and 177p are also located inside the edges of the upper film 171q, 175q and 177q and the distance between the edges of the lower film 171p, 175p and 177p and the edges of upper film 171q, 175q and 177q is uniform such that the top surface of the lower film 171p, 175p and 177p is exposed and the lateral sides of the upper film 171q, 175q and 177q and the lower film 171p, 175p and 177p form stairs as a whole.

The ohmic contacts 161 and 165 are interposed only between the underlying semiconductor stripes 151 and the overlying data lines 171 and the overlying drain electrodes 175 thereon and reduce the contact resistance therebetween. The semiconductor stripes 151 include a plurality of exposed portions, which are not covered with the data lines 171 and the drain electrodes 175, such as portions located between the source electrodes 173 and the drain electrodes 175. Although the semiconductor stripes 151 are narrower than the data lines 171 at most places, the width of the semiconductor stripes 151 becomes large near the gate lines as described above, to enhance the insulation between the gate lines 121 and the data lines 171.

A passivation layer 180 is formed on the data lines 171, the drain electrodes 175, the storage conductors 177, and the exposed portions of the semiconductor stripes 151. The passivation layer 180 is preferably made of photosensitive organic material having a good flatness characteristic, low dielectric insulating material such as a-Si:C:O and a-Si:O:F formed by plasma enhanced chemical vapor deposition (PECVD), or inorganic material such as silicon nitride.

The passivation layer 180 has a plurality of contact holes 185, 187 and 189 exposing the drain electrodes 175, the storage conductors 177, and end portions 179 of the data lines 171, respectively. The passivation layer 180 and the gate insulating layer 140 have a plurality of contact holes 182 exposing end portions 125 of the gate lines 121.

The contact holes 182, 185, 187 and 189 expose the lower films 121p, 171p, 175p and 177p of the gate lines 121, the data lines 171, the drain electrodes 175, and the storage capacitor conductors 177, respectively, and in addition, FIGS. 3 and 4 shows that the contact holes 182, 185, 187 and 189 expose an edge of the lower films 121p, 171p, 175p and 177p.

A plurality of pixel electrodes 190 and a plurality of contact assistants 92 and 97, which are preferably made of IZO, are formed on the passivation layer 180.

The pixel electrodes 190 are physically and electrically connected to the drain electrodes 175 through the contact holes 185 and to the storage capacitor conductors 177 through the contact holes 187 such that the pixel electrodes 190 receive the data voltages from the drain electrodes 175 and transmit the received data voltages to the storage capacitor conductors 177.

Referring back to FIG. 2, the pixel electrodes 190 supplied with the data voltages generate electric fields in cooperation with the common electrode 270 on the other panel 200, which reorient liquid crystal molecules in the liquid crystal layer 3 disposed therebetween.

As described above, a pixel electrode 190 and a common electrode 270 form a liquid crystal capacitor $C_{LC}$, which stores applied voltages after turn-off of the TFT Q. An additional capacitor called a "storage capacitor," which is connected in parallel to the liquid crystal capacitor $C_{LC}$, is provided for enhancing the voltage storing capacity. The storage capacitors are implemented by overlapping the pixel electrodes 190 with the gate lines 121 adjacent thereto (called "previous gate lines"). The capacitances of the storage capacitors, i.e., the storage capacitances are increased by providing the expansions 127 at the gate lines 121 for increasing overlapping areas and by providing the storage capacitor conductors 177, which are connected to the pixel electrodes 190 and overlap the expansions 127, under the pixel electrodes 190 for decreasing the distance between the terminals.

The pixel electrodes 190 overlap the gate lines 121 and the data lines 171 to increase aperture ratio but it is optional.

The contact assistants 92 and 97 are connected to the exposed end portions 125 of the gate lines 121 and the exposed end portions 179 of the data lines 171 through the contact holes 182 and 189, respectively. The contact assistants 92 and 97 are not requisites but preferred to protect the exposed portions 125 and 179 and to complement the adhesiveness of the exposed portion 125 and 179 and external devices.

As described above, the lower films 121p, 171p, 175p and 177p of the gate lines 121, the data lines 171, the drain electrodes 175, and the storage capacitor conductors 177, which has a good contact characteristic with IZO are exposed near their edges, and the contact holes 182, 185, 187 and 189 expose at least an edge of the lower films 121p, 171p, 175p and 177p. Accordingly, the pixel electrodes 190 and the contact assistants 92 and 97 are in contact with the lower films 121p, 171p, 175p and 177p with sufficiently large contact areas to provide low contact resistance. In addition, the stepwise lateral sides of the gate lines 121, the data lines 171, the drain electrodes 175, and the storage capacitor conductors 177 enable for the pixel electrodes and the contact assistants 92 and 97 to have smooth profiles without abrupt height difference.

According to another embodiment of the present invention, the pixel electrodes 190 are made of transparent conductive polymer. For a reflective LCD, the pixel electrodes 190 are made of opaque reflective metal. In these cases, the contact assistants 92 and 97 may be made of material such as IZO different from the pixel electrodes 190.

A method of manufacturing the TFT array panel shown in FIGS. 3 and 4 according to an embodiment of the present invention will be now described in detail with reference to FIGS. 5A to 8B as well as FIGS. 3 and 4.

FIGS. 5A, 6A, 7A and 8A are layout views of the TFT array panel shown in FIGS. 3 and 4 in intermediate steps of a manufacturing method thereof according to an embodiment of the present invention, and FIGS. 5B, 6B, 7B and 8B are sectional views of the TFT array panel shown in FIGS. 5A, 6A, 7A and 8A taken along the lines VB-VB', VIB-VIB', VIIB-VIIB' and VIIIB-VIIIB', respectively.

Two conductive films, a lower conductive film and an upper conductive film are sputtered in sequence on an insulating substrate 110 such as transparent glass. The lower conductive film is preferably made of material such as Mo, Mo alloy and Cr having a good contact characteristic with IZO, and preferably has a thickness of about 500 Å. The upper conductive film is preferably made of Al containing metal, and preferably has a thickness of about 2,500 Å.

Figure 5A:
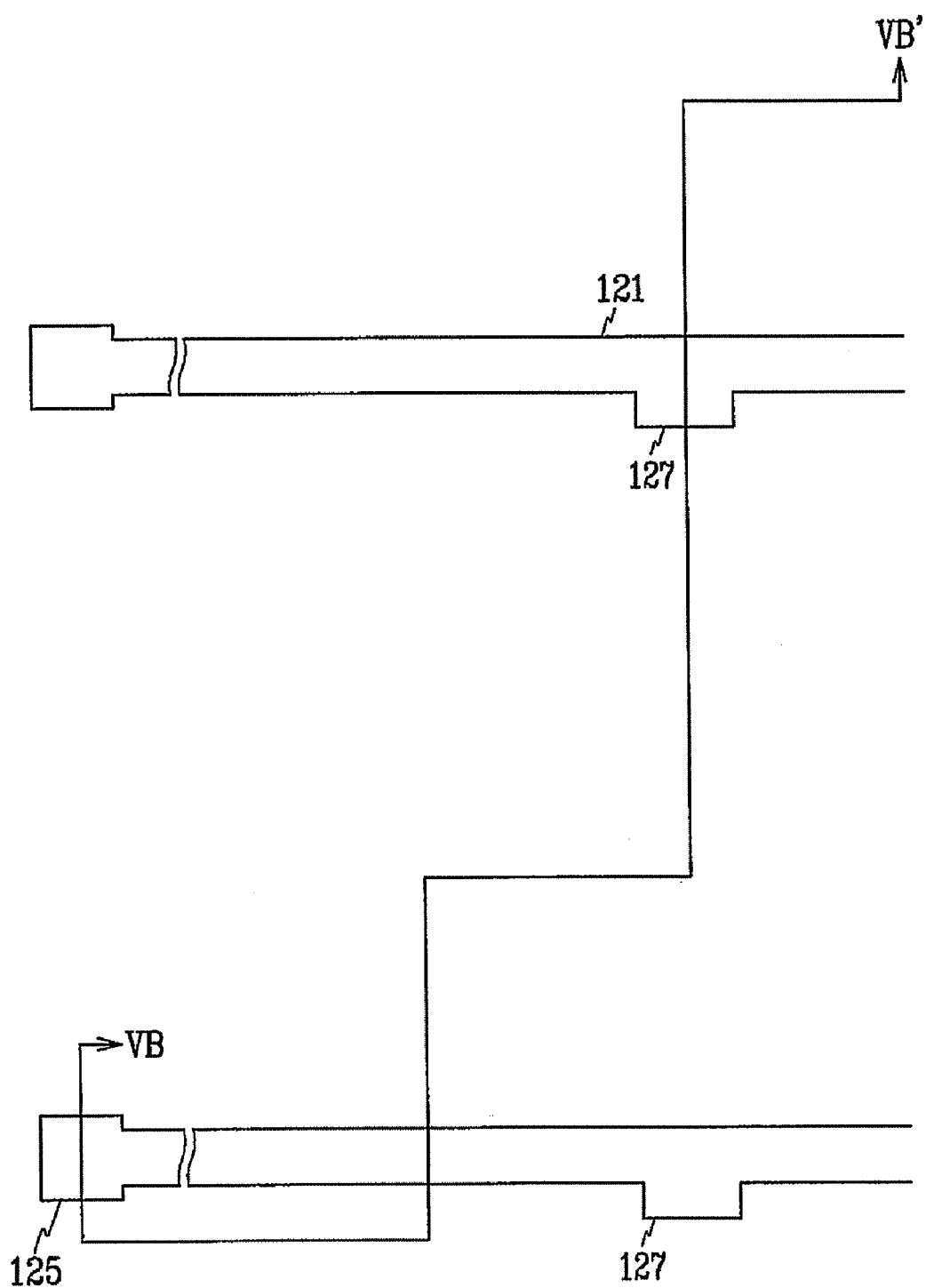
FIGS. 5A, 6A, 7A and 8A are layout views of the TFT array panel shown in FIGS. 3 and 4 in intermediate steps of a manufacturing method thereof according to an embodiment of the present invention.
Figure 5B:
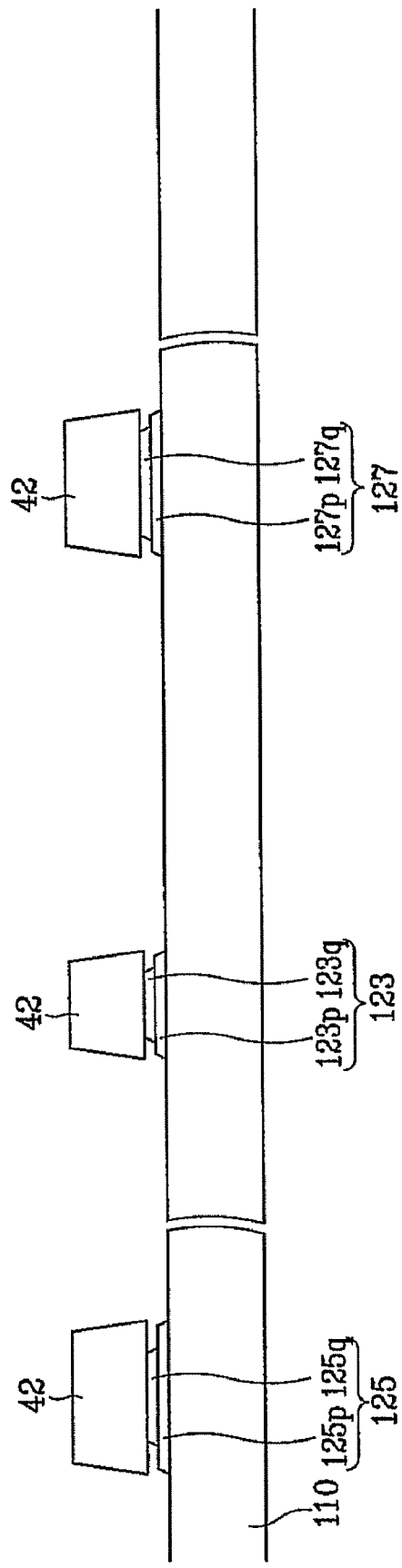
FIGS. 5B, 6B, 7B and 8B are sectional views of the TFT array panel shown in FIGS. 5A, 6A, 7A and 8A taken along the lines VB-VB', VIB-VIB', VIIB-VIIB' and VIIIB-VIIIB', respectively.

Referring to FIGS. 5A and 5B, after forming a photoresist 42 on the upper conductive film, the upper conductive film and the lower conductive film are patterned in sequence using the photoresist 42 as an etch mask to form a plurality of gate lines 121 including a plurality of gate electrodes 123 and a plurality of expansions 127, and then the removal of the photoresist 42 follows.

The patterning of the upper film 121q is performed by wet etching preferably using an Al etchant including 5-8% $CF_3COOH$, 5-8% $HNO_3$, 50-60% $H_3PO_4$ and remaining $H_2O$, which can etch both Al and Mo with inclined etch profiles. Since the wet etching isotropically etches an object, the portions of the upper film 121q under the edges of the photoresist 42 are etched out due to the lateral etch to produce undercut. The patterning of the lower film 121p is performed by dry etching with maintaining the photoresist 42. Since the dry etching anisotropically etches an object, for example, etches the object along a vertical direction, the dry etching produces almost vertical etch profiles such that the edges of the patterned lower film 121p nearly correspond to those of the photoresist 42 such that the edges of the lower film 121p lie outside the edges of the upper film 121q. Furthermore, since the patterning of the upper film 121q and the lower film 121p is performed by using different types of etching with the same photoresist, the distance between the edges of the lower film 121p and those of the upper film 121q is uniform.

Figure 6A:
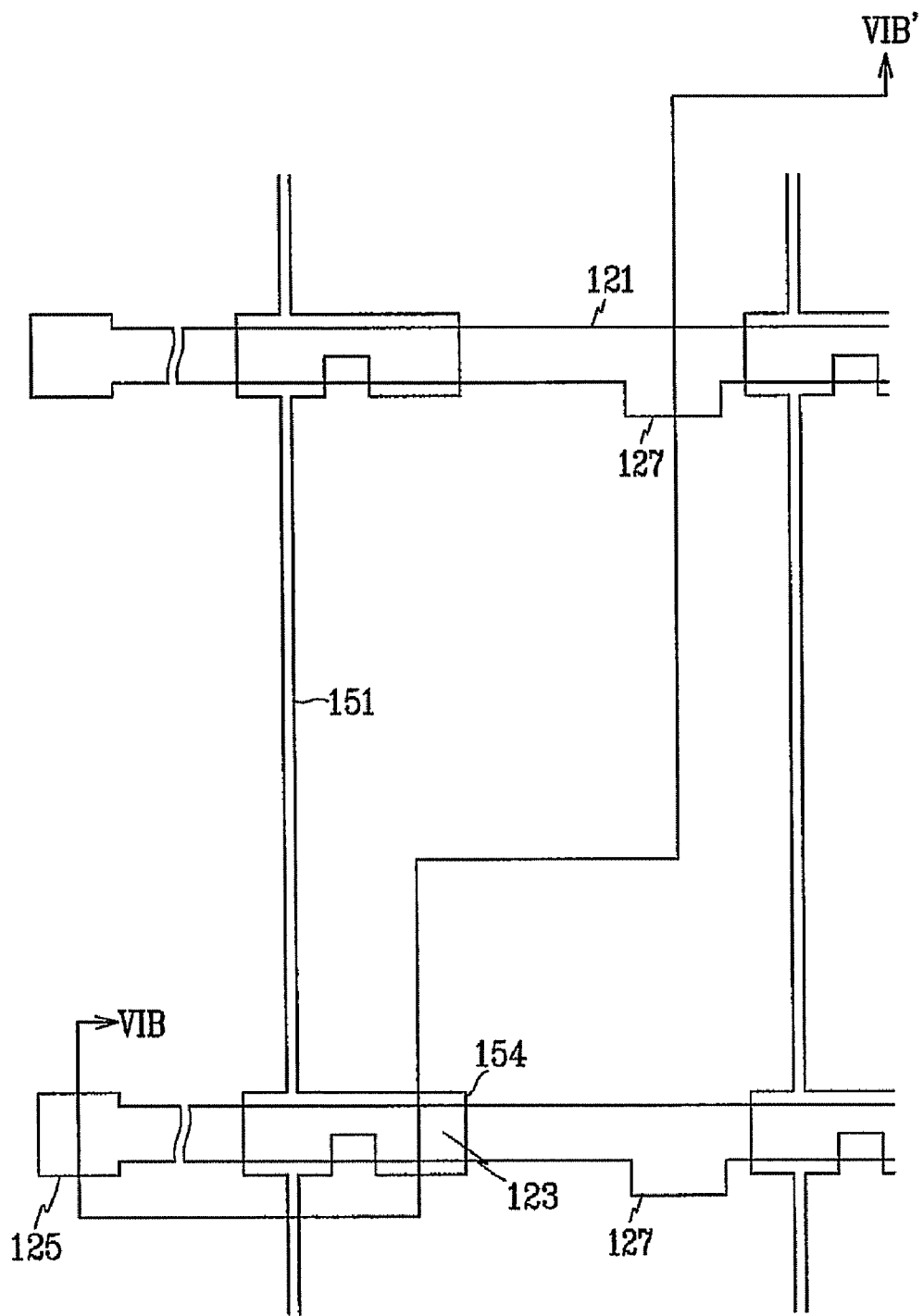
Figure 6B:
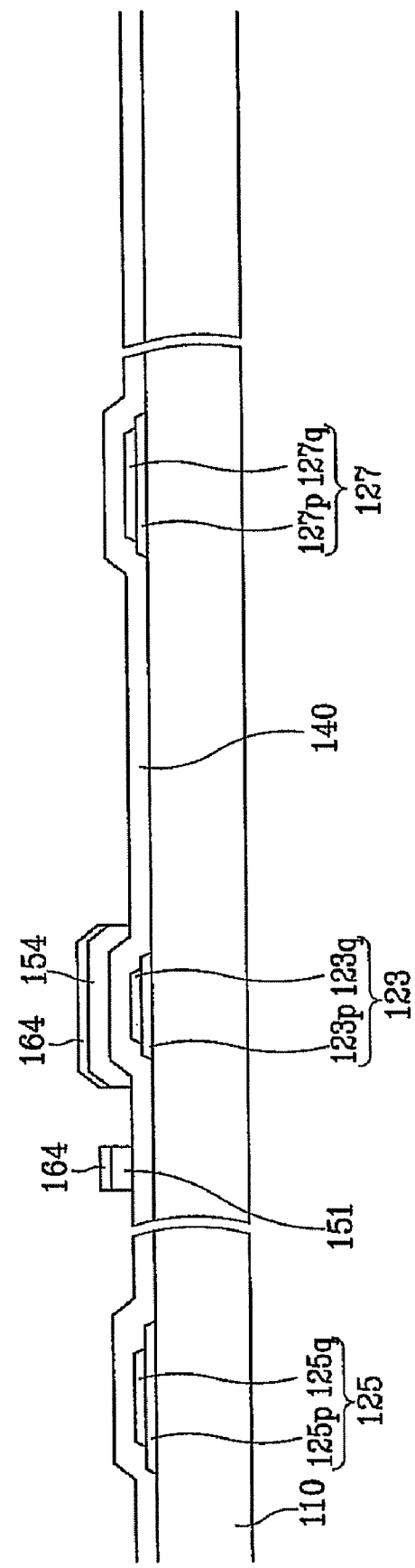

Referring to FIGS. 6A and 6B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including a plurality of projections 154 on the gate insulating layer 140. The gate insulating layer 140 is preferably made of silicon nitride with thickness of about 2,000 Å to about 5,000 Å, and the deposition temperature is preferably in a range between about 250° C. and about 500° C.

Two conductive films, a lower conductive film and an upper conductive film are sputtered in sequence. The lower conductive film is preferably made of Cr having a good contact characteristic with IZO, and preferably has a thickness of about 500 Å. It is preferable that the upper conductive film has a thickness of about 2,500 Å, the sputtering target for the upper conductive film includes pure Al or Al—Nd containing 2 atomic % Nd, and the sputtering temperature is about 150° C.

Figure 7A:
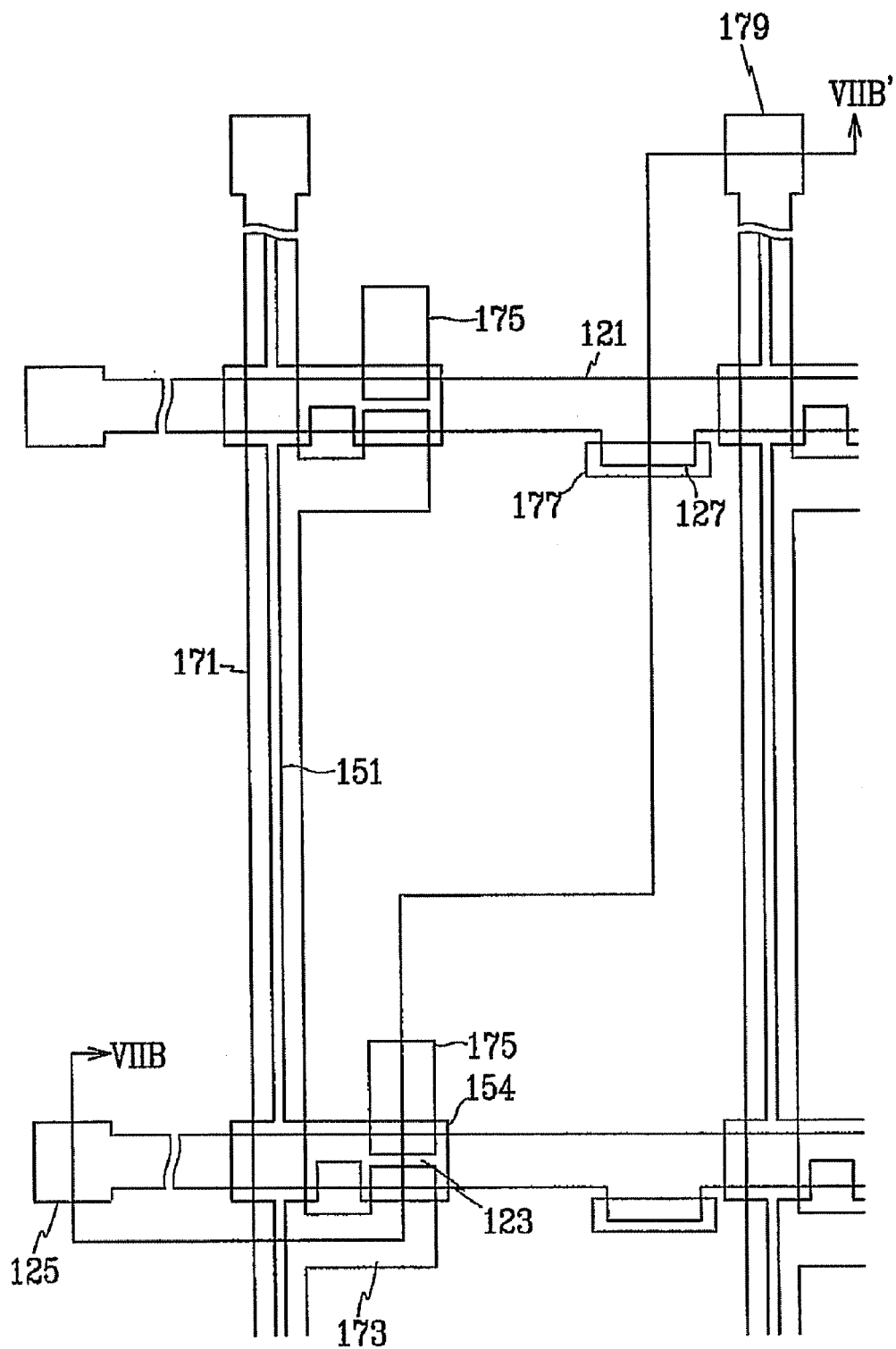
Figure 7B:
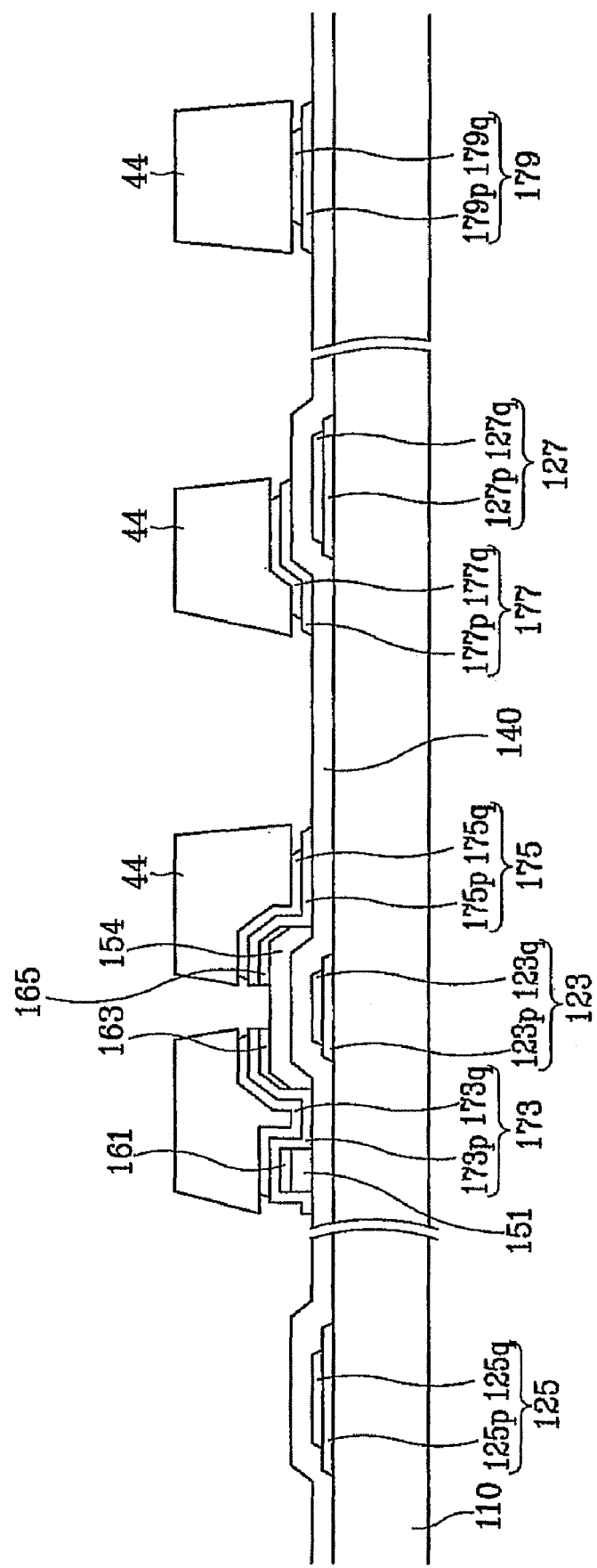

Referring to FIGS. 7A and 7B, after forming a photoresist 44 on the upper conductive film, the upper conductive film and the lower conductive film are wet-etched and dry-etched, respectively, using the photoresist as an etch mask to form a plurality of data lines 171 including a plurality of source electrodes 173, a plurality of drain electrodes 175, and a plurality of storage capacitor conductors 177. The etching conditions may be equal to those of the gate lines 121. Like the gate lines, the edges of the lower film 171p, 175p and 177p lie outside the edges of the upper film 171q, 175q and 177q and separated therefrom by a uniform distance.

Thereafter, portions of the extrinsic semiconductor stripes 164, which are not covered with the data lines 171, the drain electrodes 175, and the storage capacitor conductors 177, are removed to complete a plurality of ohmic contact stripes 161 including a plurality of projections 163 and a plurality of ohmic contact islands 165 and to expose portions of the intrinsic semiconductor stripes 151. Oxygen plasma treatment preferably follows thereafter in order to stabilize the exposed surfaces of the semiconductor stripes 151.

Figure 8A:
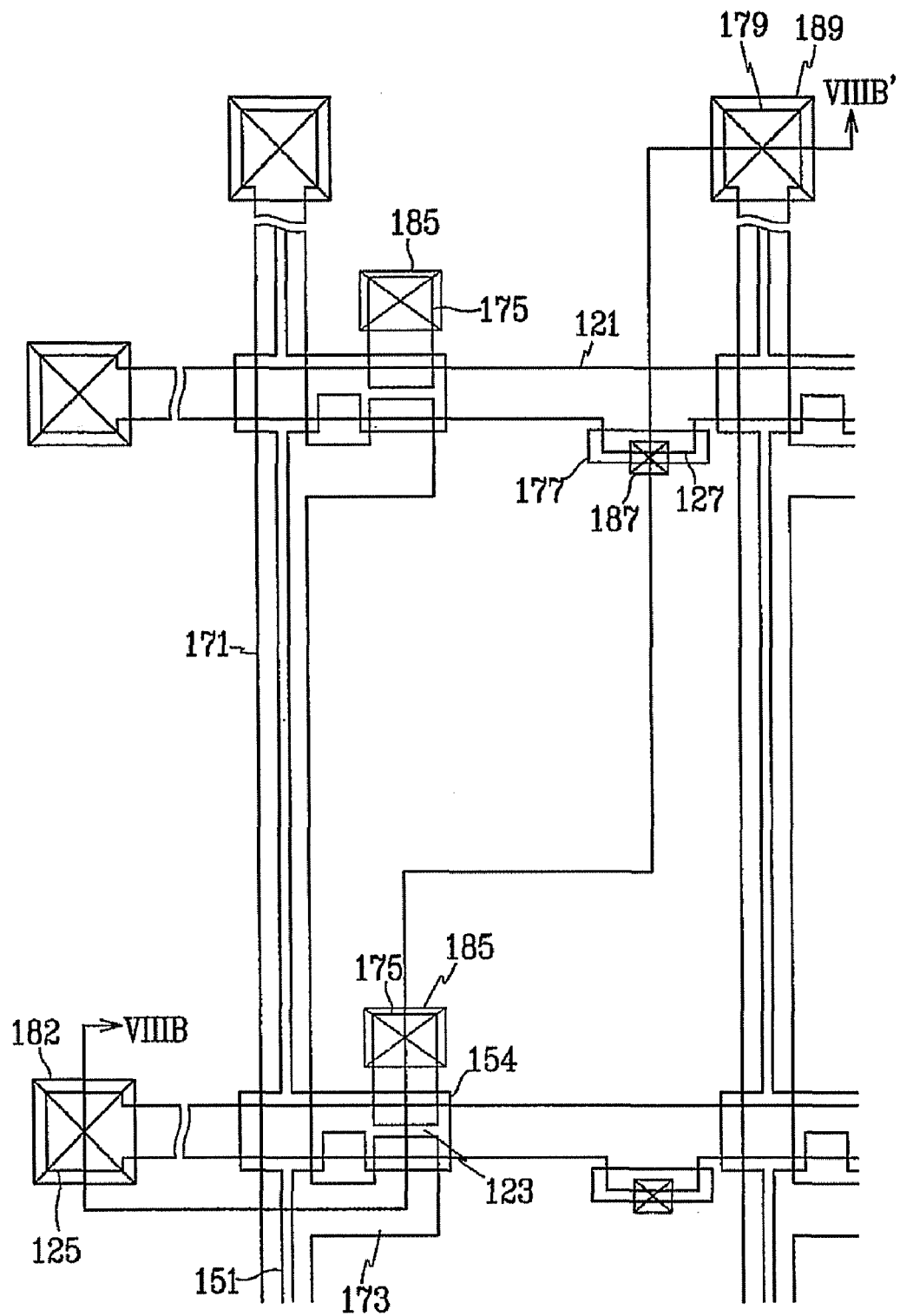
Figure 8B:
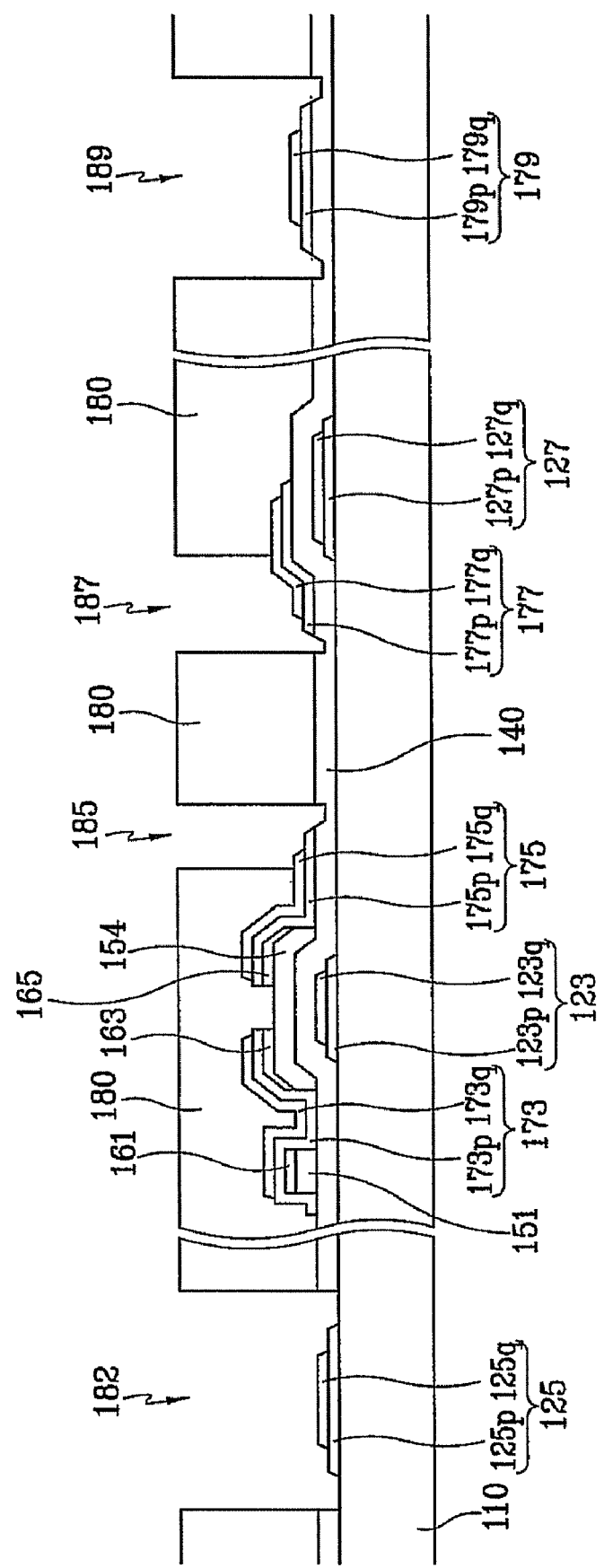

As shown in FIGS. 8A and 8B, after depositing a passivation layer 180, the passivation layer 180 and the gate insulating layer 140 are dry-etched using photolithography to form a plurality of contact holes 182, 185, 187 and 189 exposing the lower films 121p, 175p, 177p and 179p of end portions 125 of the gate lines 121, the drain electrodes 175, the storage capacitor conductors 177, and end portions 179 of the data lines 171, respectively. FIGS. 8A and 8B show that the contact holes 182, 185, 187 and 189 expose the edges of the lower films 121p, 175p, 177p and 179p, and then upper portions of the gate insulating layer 140 located in the contact holes 182, 185, 187 and 189 are etched out or removed out to expose the top surface of the substrate 110.

Finally, as shown in FIGS. 3 and 4, a plurality of pixel electrodes 190 and a plurality of contact assistants 92 and 97 are formed on the passivation layer 180 by sputtering and photo-etching an IZO layer. An example of sputtering target is IDIXO (indium x-metal oxide) produced by Idemitsu Co. of Japan. The sputtering target includes $In_2O_3$ and ZnO, and the ratio of Zn with respect to the sum of Zn and In is preferably in a range of about 15-20 atomic %. The preferred sputtering temperature for minimizing the contact resistance is equal to or lower than about 250° C.

In the TFT array panel according to an embodiment of the present invention, the gate lines 121 and the data lines 171 include Al or Al alloy with low resistivity while they have minimized contact resistance between the IZO pixel electrodes 190. Moreover, the Al containing metal film is removed near the edges of the contact structures by using different types of etching without an additional photo etching step, thereby simplifying the manufacturing process.

A TFT array panel for an LCD according to another embodiment of the present invention will be described in detail with reference to FIGS. 9-11.

Figure 9:
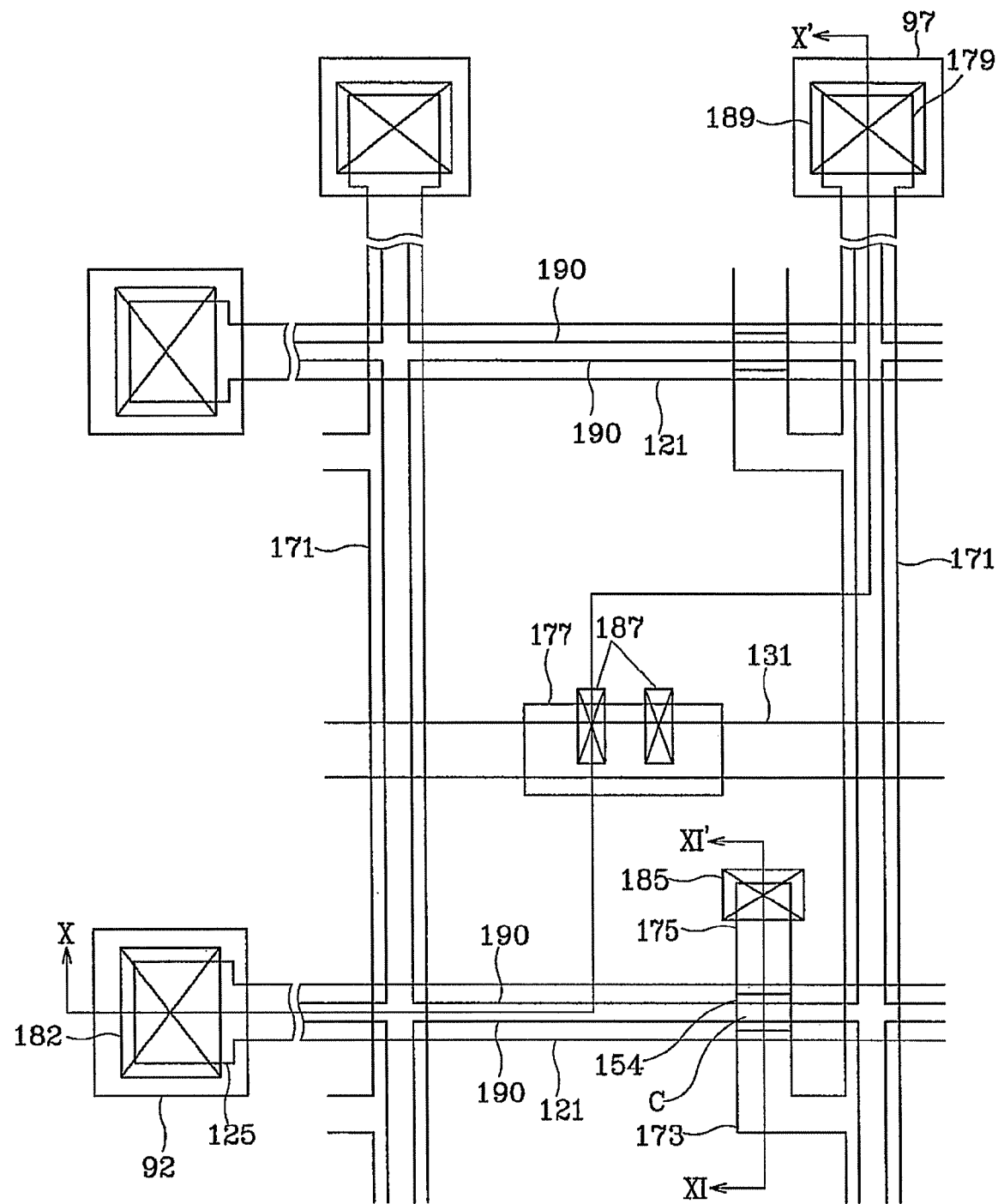
FIG. 9 is a layout view of an exemplary TFT array panel for an LCD according to another embodiment of the present invention.
Figure 10:
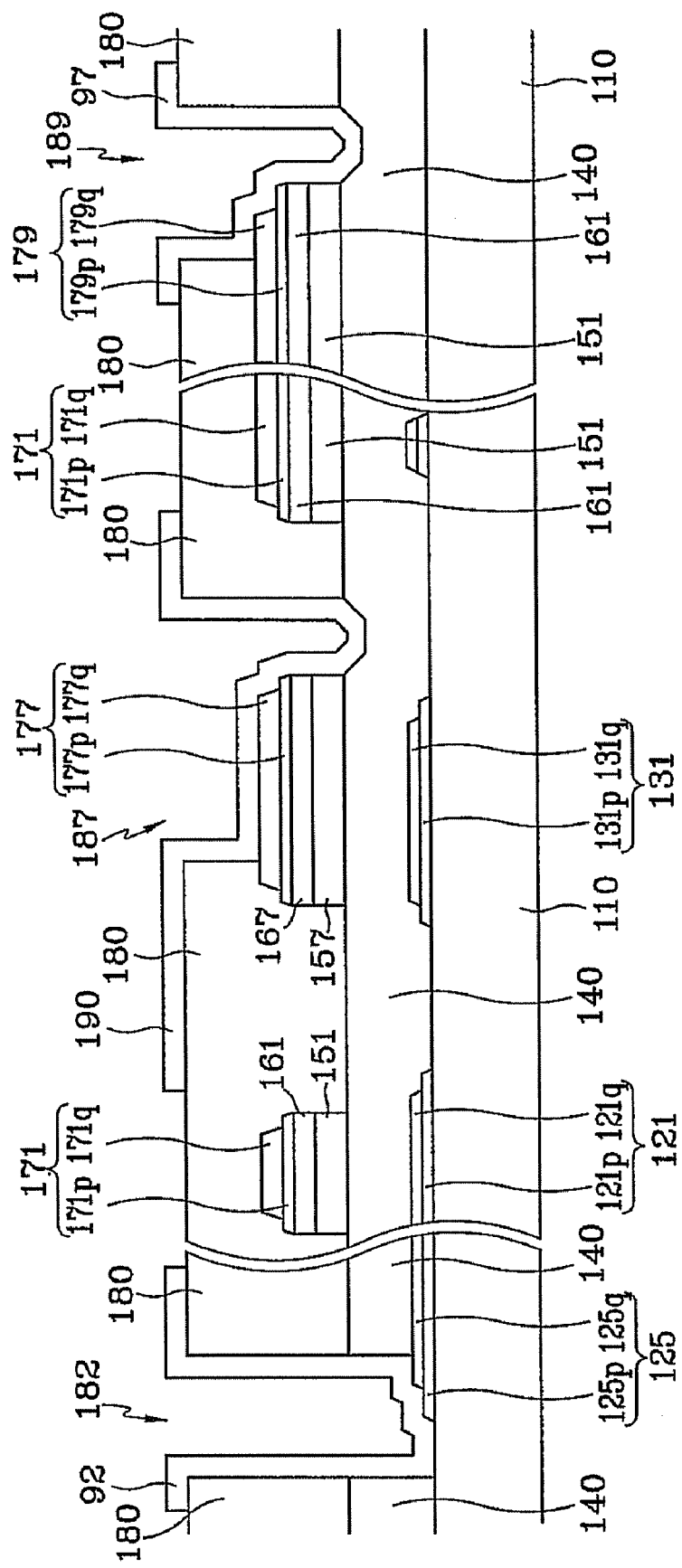
FIGS. 10 and 11 are sectional views of the TFT array panel shown in FIG. 9 taken along the lines X-X' and XI-XI', respectively.
Figure 11:
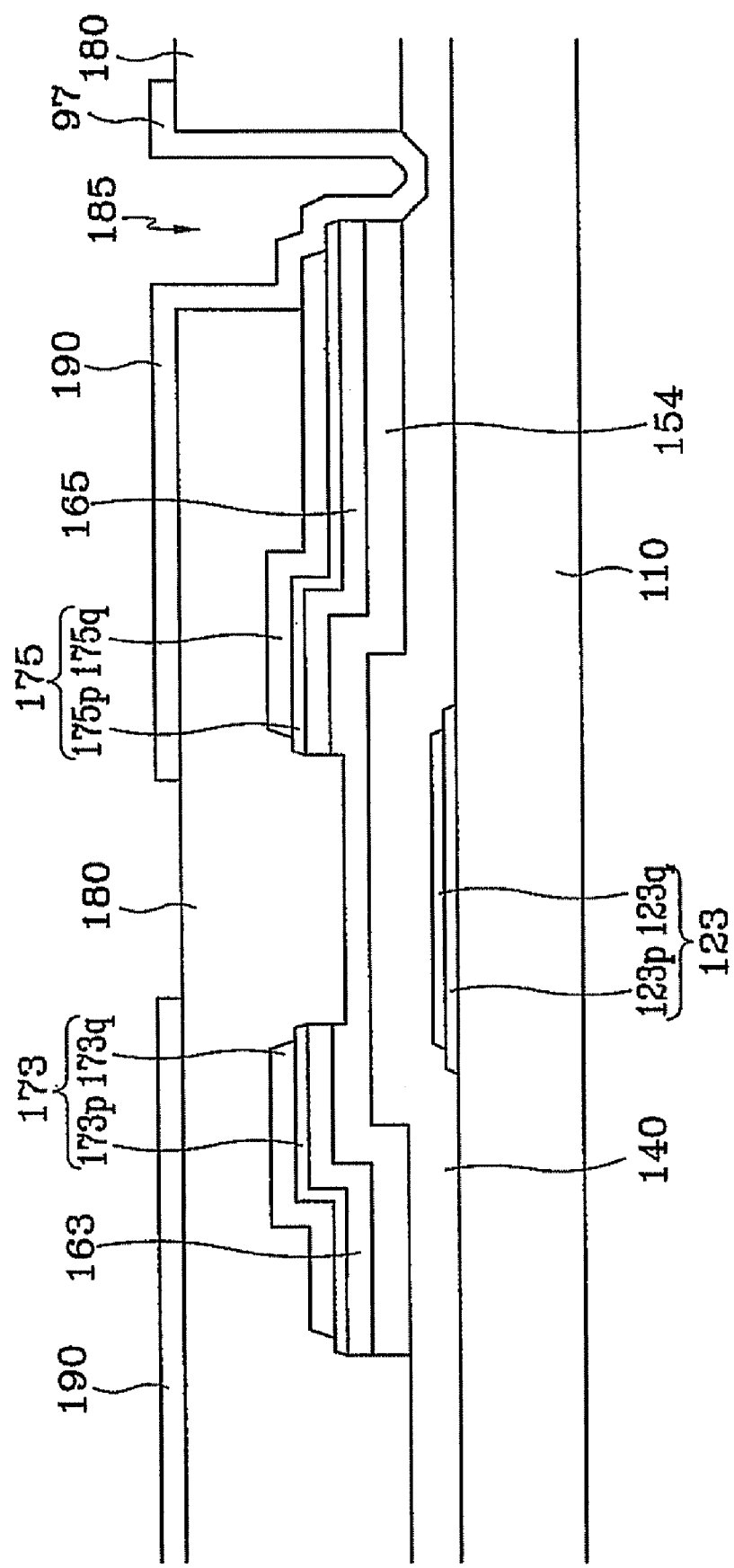

FIG. 9 is a layout view of an exemplary TFT array panel for an LCD according to another embodiment of the present invention, and FIGS. 10 and 11 are sectional views of the TFT array panel shown in FIG. 9 taken along the line X-X' and the line XI-XI', respectively.

As shown in FIGS. 9-11, a layered structure of a TFT array panel of an LCD according to this embodiment is almost the same as that shown in FIGS. 3 and 4. That is, a plurality of gate lines 121 including a plurality of gate electrodes 123 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173, a plurality of drain electrodes 175, and a plurality of storage capacitor conductors 177 are formed on the ohmic contacts 161 and 165, and a passivation layer 180 is formed thereon. A plurality of contact holes 182, 185, 187 and 189 are provided at the passivation layer 180 and/or the gate insulating layer 140, and a plurality of pixel electrodes 190 and a plurality of contact assistants 92 and 97 are formed on the passivation layer 180.

Different from the TFT array panel shown in FIGS. 3 and 4, the TFT array panel according to this embodiment provides a plurality of storage electrode lines 131, which are separated from the gate lines 121, on the same layer as the gate lines 121, and overlaps the storage electrode lines 131 with the storage capacitor conductors 177 to form storage capacitors without expansions of the gate lines 121. The storage electrode lines 131 include, like the gate lines, a lower film 131p and an upper film 131q and the edges of the upper film 131q lie within the edges of the lower film 131p with maintaining a uniform distance therefrom. The storage electrode lines 131 are supplied with a predetermined voltage such as the common voltage. The storage electrode lines 131 along with the storage capacitor conductors 177 may be omitted if the storage capacitance generated by the overlapping of the gate lines 121 and the pixel electrodes 190 is sufficient.

In addition, as well as the semiconductor stripes 151 and the ohmic contacts 161 and 165, a plurality of semiconductor islands 157 and a plurality of ohmic contacts 167 thereover are provided between the storage conductors 177 and the gate insulating layer 140.

The semiconductor stripes and islands 151 and 157 have almost the same planar shapes as the data lines 171, the drain electrodes 175 and the storage capacitor conductors 177 as well as the underlying ohmic contacts 161, 165 and 167, except for the projections 154 where TFTs are provided. In particular, the semiconductor islands 157, the ohmic contact islands 167 and the storage conductors 177 have substantially the same planar shape. The semiconductor stripes 151 include some exposed portions, which are not covered with the data lines 171, the drain electrodes 175 and the storage conductors 177, such as portions located between the source electrodes 173 and the drain electrodes 175.

Now, a method of manufacturing the TFT array panel shown in FIGS. 9-11 according to an embodiment of the present invention will be described in detail with reference to FIGS. 12A-18 C as well as FIGS. 9-11.

Figure 12A:
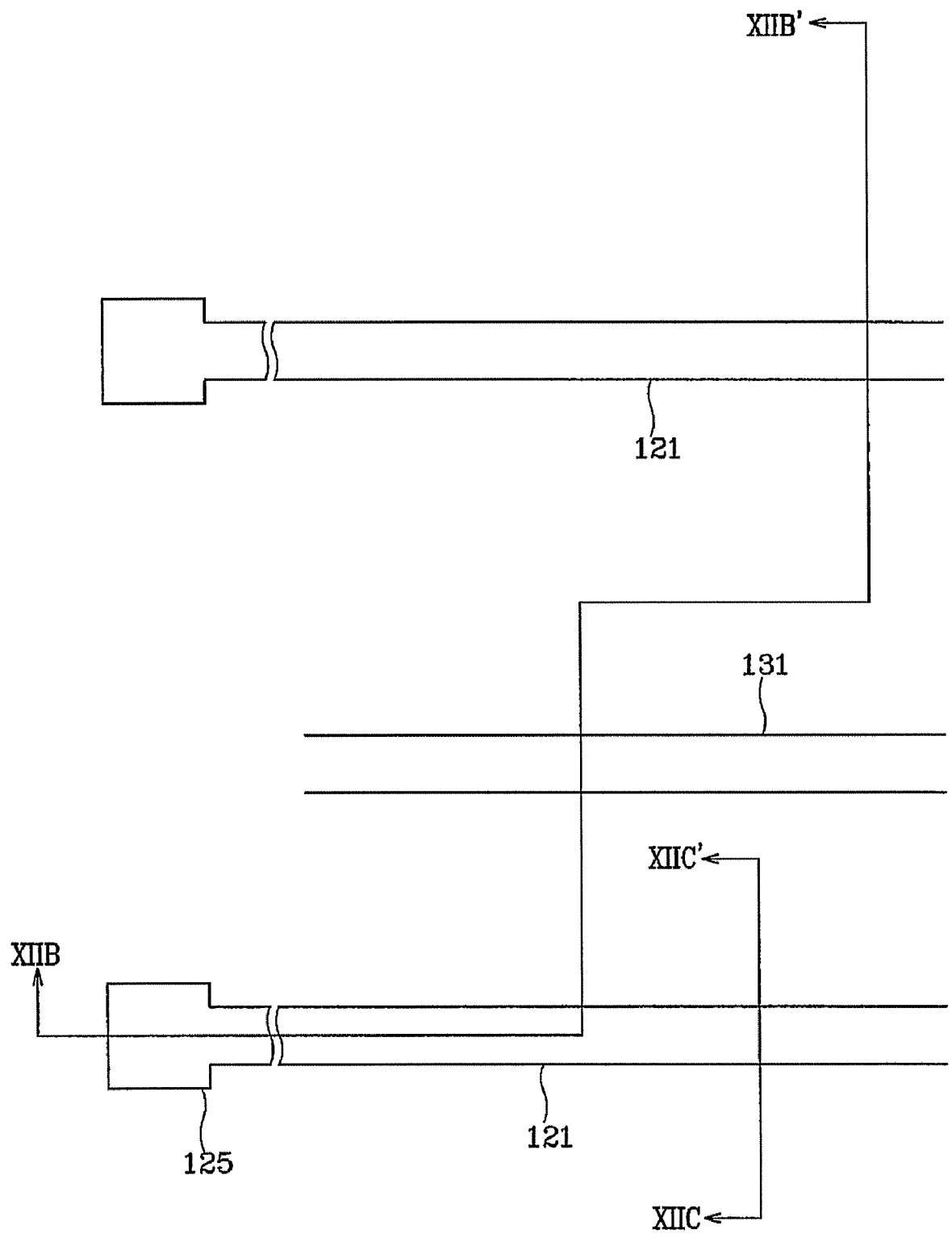
FIG. 12A is a layout view of a TFT array panel shown in FIGS. 9-11 in the first step of a manufacturing method thereof according to an embodiment of the present invention.
Figure 12B:
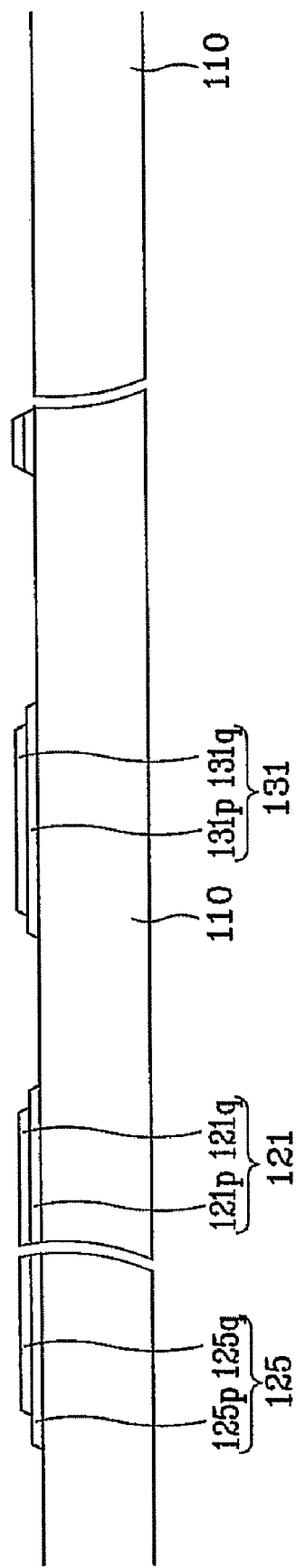
Figure 13B:
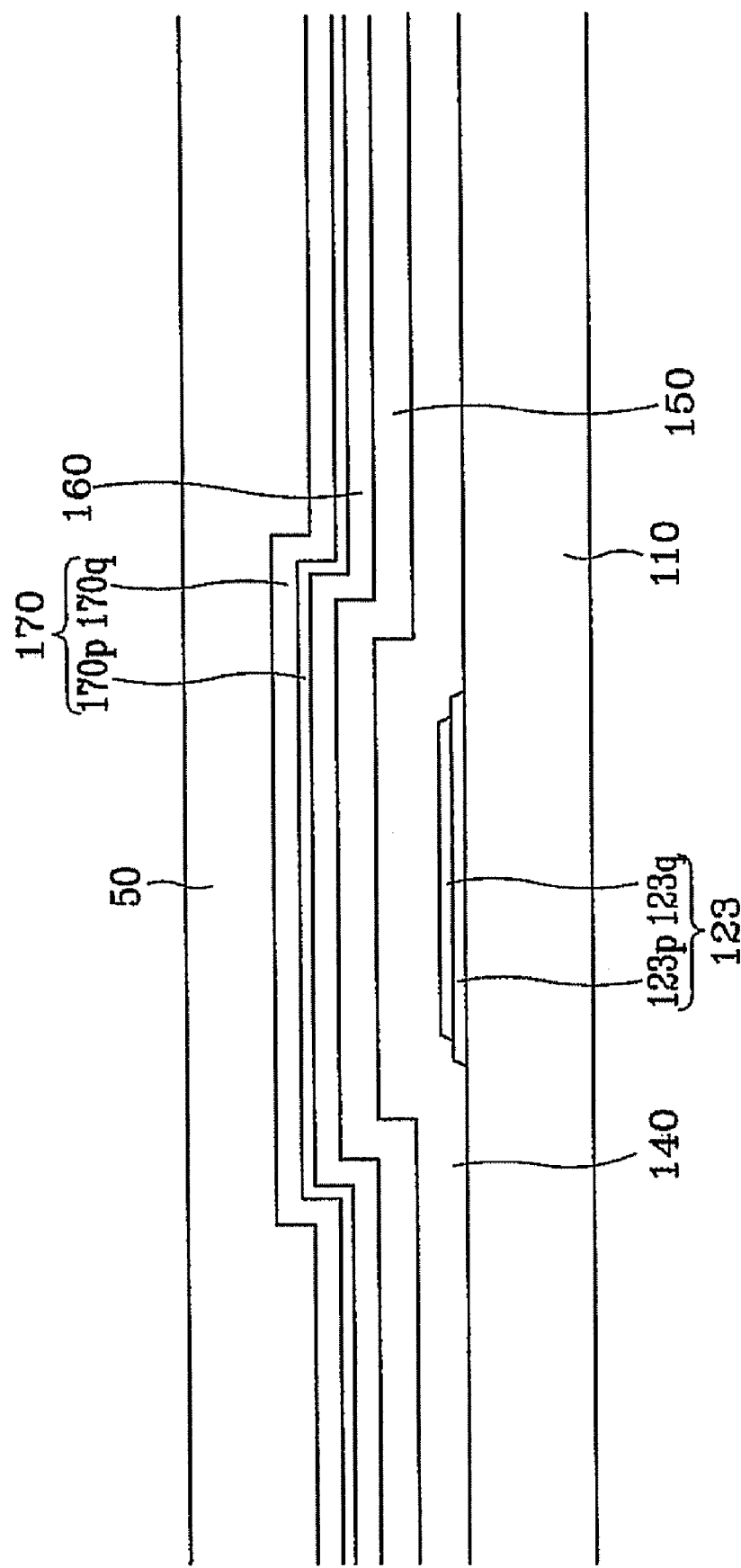
Figure 14A:
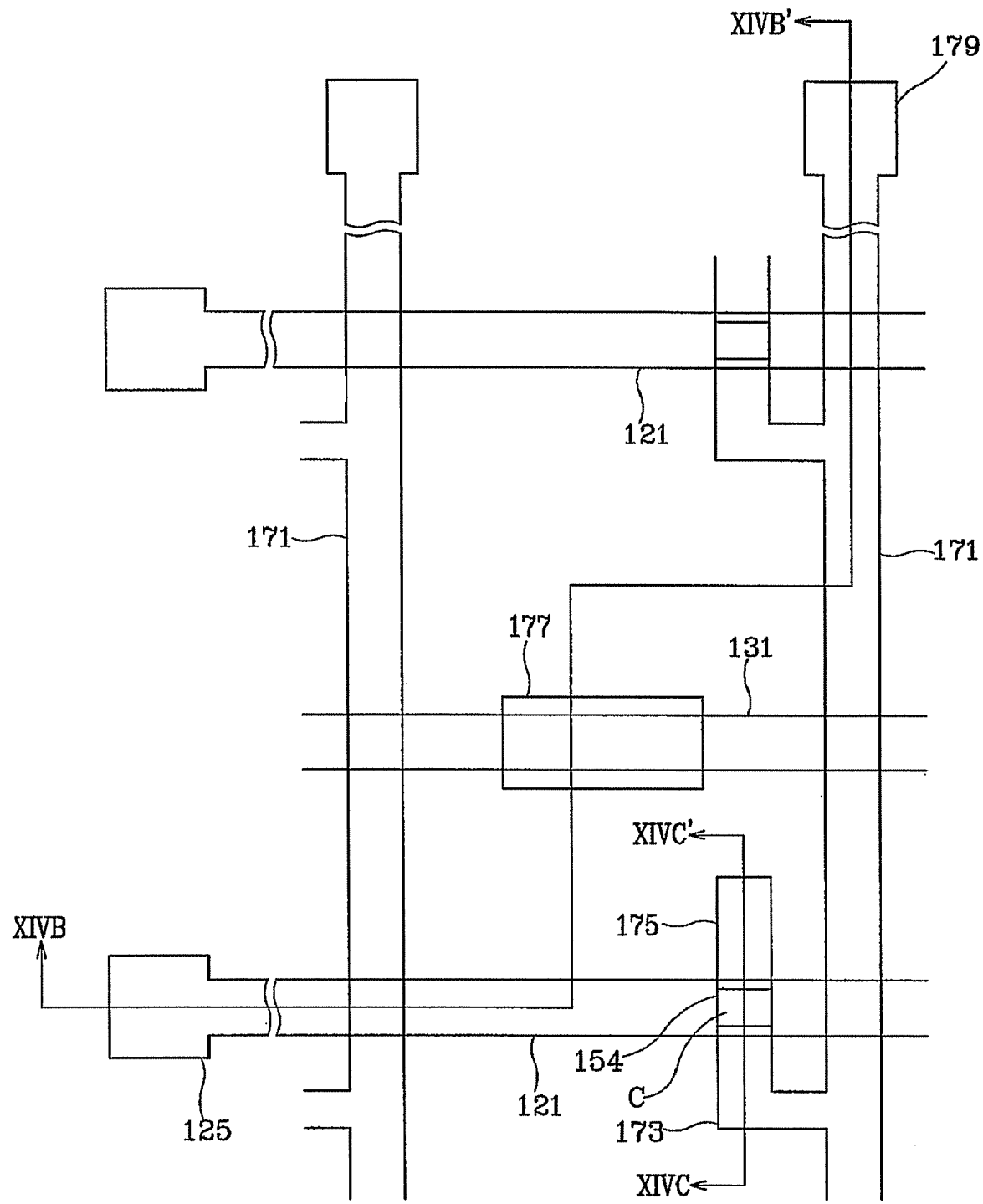
FIG. 14A is a layout view of the TFT array panel in the step following the step shown in FIGS. 13A and 13B.
Figure 14B:
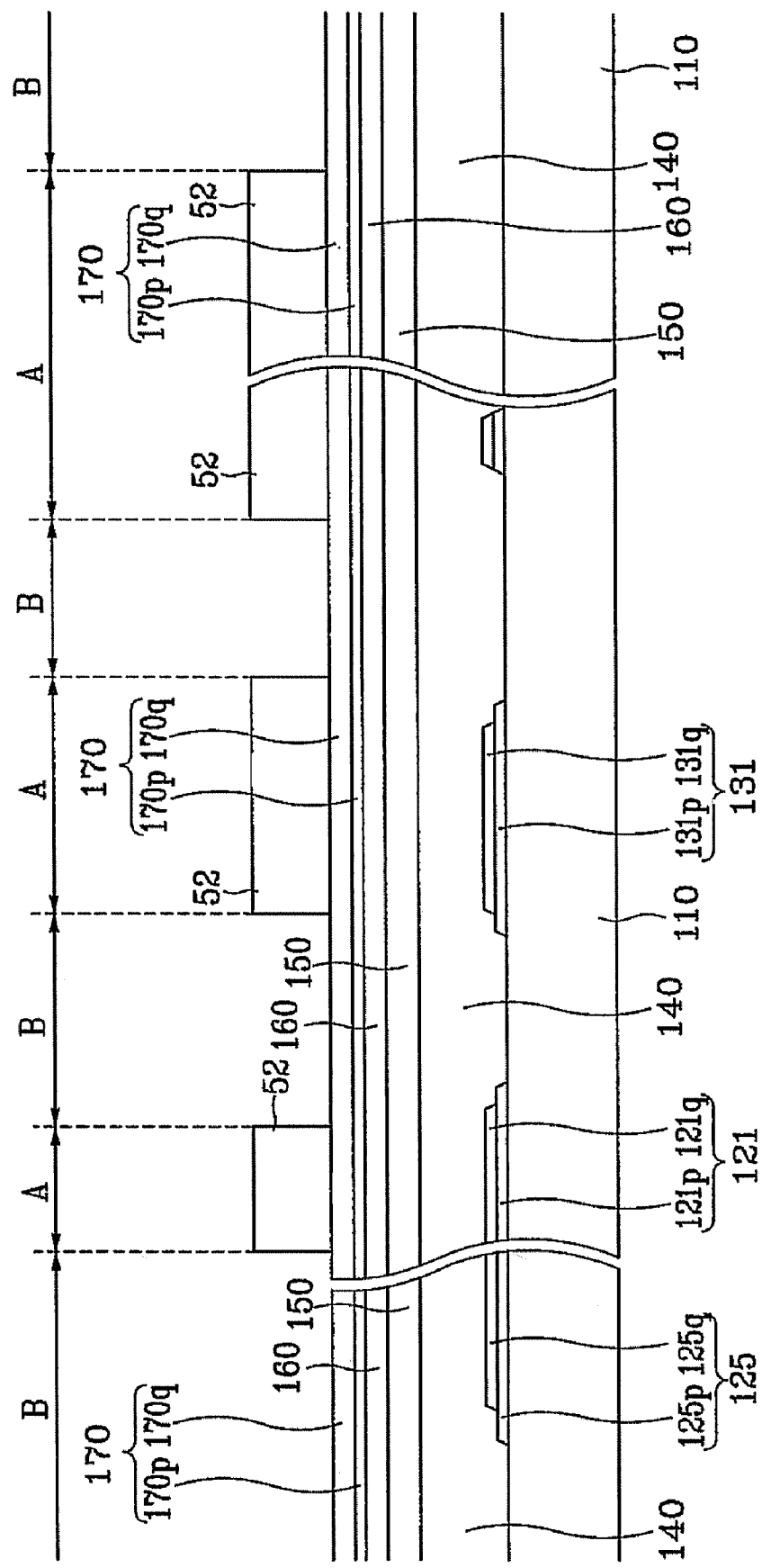

FIG. 12A is a layout view of a TFT array panel shown in FIGS. 9-11 in the first step of a manufacturing method thereof according to an embodiment of the present invention; FIGS. 12B and 12C are sectional views of the TFT array panel shown in FIG. 12A taken along the lines XIIB-XIIB' and XIIC-XIIC', respectively; FIGS. 13A and 13B are sectional views of the TFT array panel shown in FIG. 12A taken along the lines XIIB-XIIB' and XIIC-XIIC', respectively, and illustrate the step following the step shown in FIGS. 12B and 12C; FIG. 14A is a layout view of the TFT array panel in the step following the step shown in FIGS. 13A and 13B; FIGS. 14B and 14C are sectional views of the TFT array panel shown in FIG. 14A taken along the lines XIVB-XIVB' and XIVC-XIVC', respectively; FIGS. 15A, 16A and 17A and FIGS. 15B, 16B and 16B are respective sectional views of the TFT array panel shown in FIG. 14A taken along the lines XIVB-XIVB' and XIVC-XIVC', respectively, and illustrate the steps following the step shown in FIGS. 14B and 14C; FIG. 18A is a layout view of a TFT array panel in the step following the step shown in FIGS. 17A and 17B; and FIGS. 18B and 18C are sectional views of the TFT array panel shown in FIG. 18A taken along the lines XVIIIB-XVIIIB' and XVIIIC-XVIIIC', respectively.

Referring to FIGS. 12A-12C, a plurality of gate lines 121 including a plurality of gate electrodes 123 and a plurality of storage electrode lines 131 are formed on a substrate 110 by photo etching. The gate lines 121 and the storage electrode lines 131 include lower films 121p and 131p and the upper firms 121q and 131q.

As shown in FIGS. 13A and 13B, a gate insulating layer 140, an intrinsic a-Si layer 150, and an extrinsic a-Si layer 160 are sequentially deposited by CVD such that the layers 140, 150 and 160 bear thickness of about 1,500-5,000 Å, about 500-2,000 Å and about 300-600 Å, respectively. A conductive layer 170 including a lower film 170p and an upper film 170q is deposited by sputtering, and a photoresist film 50 with the thickness of about 1-2 microns is coated on the conductive layer 170.

The photoresist film 50 is exposed to light through an exposure mask (not shown), and developed such that the developed photoresist has a position dependent thickness. The photoresist shown in FIGS. 14B and 14C includes a plurality of first to third portions with decreased thickness. The first portions 52 located on wire areas A and the second portions 54 located on channel areas C are indicated by reference numerals 52 and 54, respectively, and no reference numeral is assigned to the third portions located on remaining areas B since they have substantially zero thickness to expose underlying portions of the conductive layer 170. The thickness ratio of the second portions 54 to the first portions 52 is adjusted depending upon the process conditions in the subsequent process steps. It is preferable that the thickness of the second portions 54 is equal to or less than half of the thickness of the first portions 52, and in particular, equal to or less than 4,000 Å.

The position-dependent thickness of the photoresist is obtained by several techniques, for example, by providing translucent areas on the exposure mask as well as transparent areas and light blocking opaque areas. The translucent areas may have a slit pattern, a lattice pattern, a thin film(s) with intermediate transmittance or intermediate thickness. When using a slit pattern, it is preferable that the width of the slits or the distance between the slits is smaller than the resolution of a light exposure used for the photolithography. Another example is to use reflowable photoresist. In detail, once a photoresist pattern made of a reflowable material is formed by using a normal exposure mask only with transparent areas and opaque areas, it is subject to reflow process to flow onto areas without the photoresist, thereby forming thin portions.

The different thickness of the photoresist 52 and 54 enables to selectively etch the underlying layers when using suitable process conditions. Therefore, a plurality of data lines 171 including a plurality of source electrodes 173, a plurality of drain electrodes 175, and a plurality of storage conductors 177 as well as a plurality of ohmic contact stripes 161 including a plurality of projections 163, a plurality of ohmic contact islands 165 and 167, a plurality of semiconductor stripes 151 including a plurality of projections 154, and a plurality of semiconductor islands 157 are obtained by a series of etching steps.

For descriptive purpose, portions of the conductive layer 170, the extrinsic a-Si layer 160, and the intrinsic a-Si layer 150 on the wire areas A are called first portions, portions of the conductive layer 170, the extrinsic a-Si layer 160, and the intrinsic a-Si layer 150 on the channel areas C are called second portions, and portions of the conductive layer 170, the extrinsic a-Si layer 160, and the intrinsic a-Si layer 150 on the remaining areas B are called third portions.

An exemplary sequence of forming such a structure is as follows:

(1) Removal of third portions of the conductive layer 170, the extrinsic a-Si layer 160 and the intrinsic a-Si layer 150 on the wire areas A;

(2) Removal of the second portions 54 of the photoresist;

(3) Removal of the second portions of the conductive layer 170 and the extrinsic a-Si layer 160 on the channel areas C; and (4) Removal of the first portions 52 of the photoresist.

Another exemplary sequence is as follows:

(1) Removal of the third portions of the conductive layer 170;

(2) Removal of the second portions 54 of the photoresist;

(3) Removal of the third portions of the extrinsic a-Si layer 160 and the intrinsic a-Si layer 150;

(4) Removal of the second portions of the conductive layer 170;

(5) Removal of the first portions 52 of the photoresist; and (6) Removal of the second portions of the extrinsic a-Si layer 160.

The first example is described in detail.

Figure 15A:
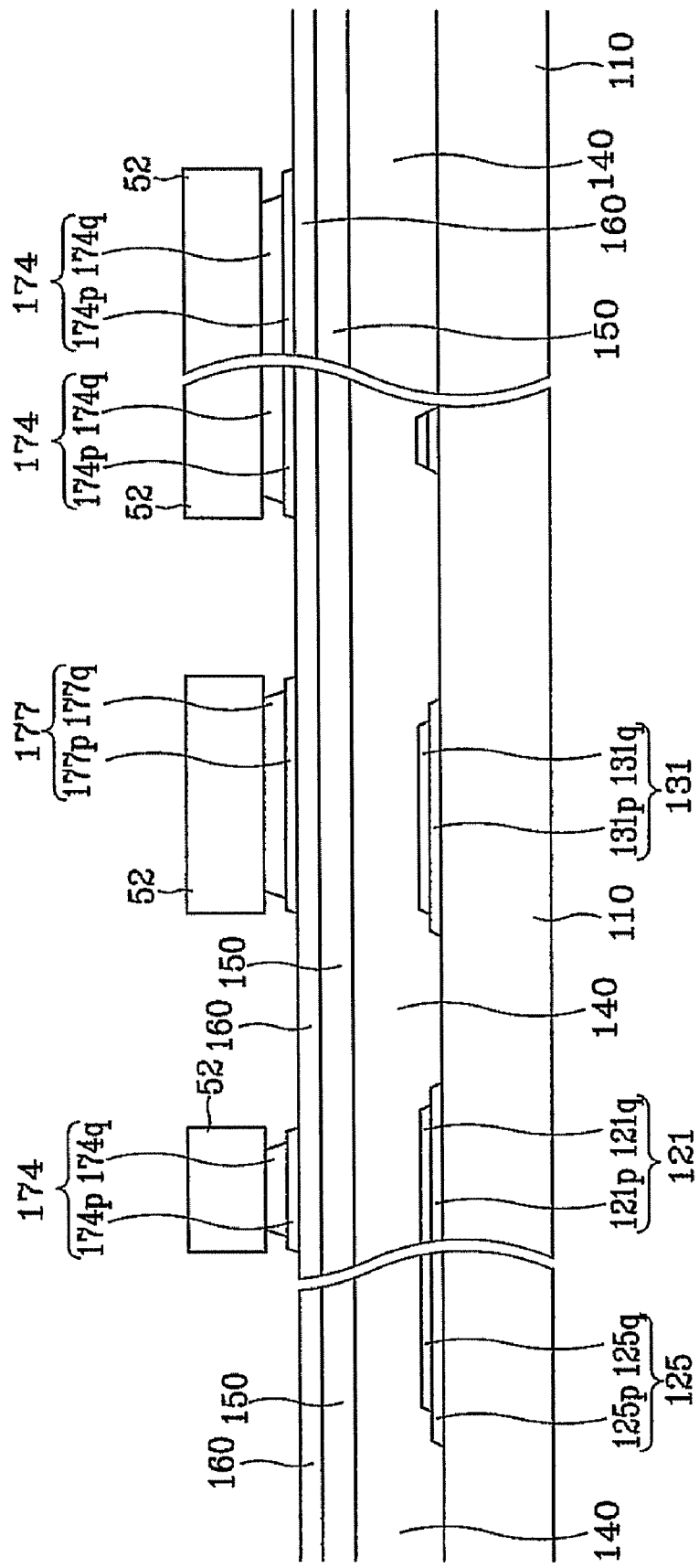

As shown in FIGS. 15A and 15B, the exposed third portions of the upper film 170q of the conductive layer 170 on the wire areas B are removed by wet etching and the exposed third portions of the lower film 170p are removed by dry etch to expose the underlying third portions of the extrinsic a-Si layer 160.

The storage capacitor conductors 177 are completed in this step and reference numeral 174 indicates portions of the conductive layer 170 including the data lines 171 and the drain electrode 175 connected to each other. The dry etching may etch out the top portions of the photoresist 52 and 54.

Figure 16A:
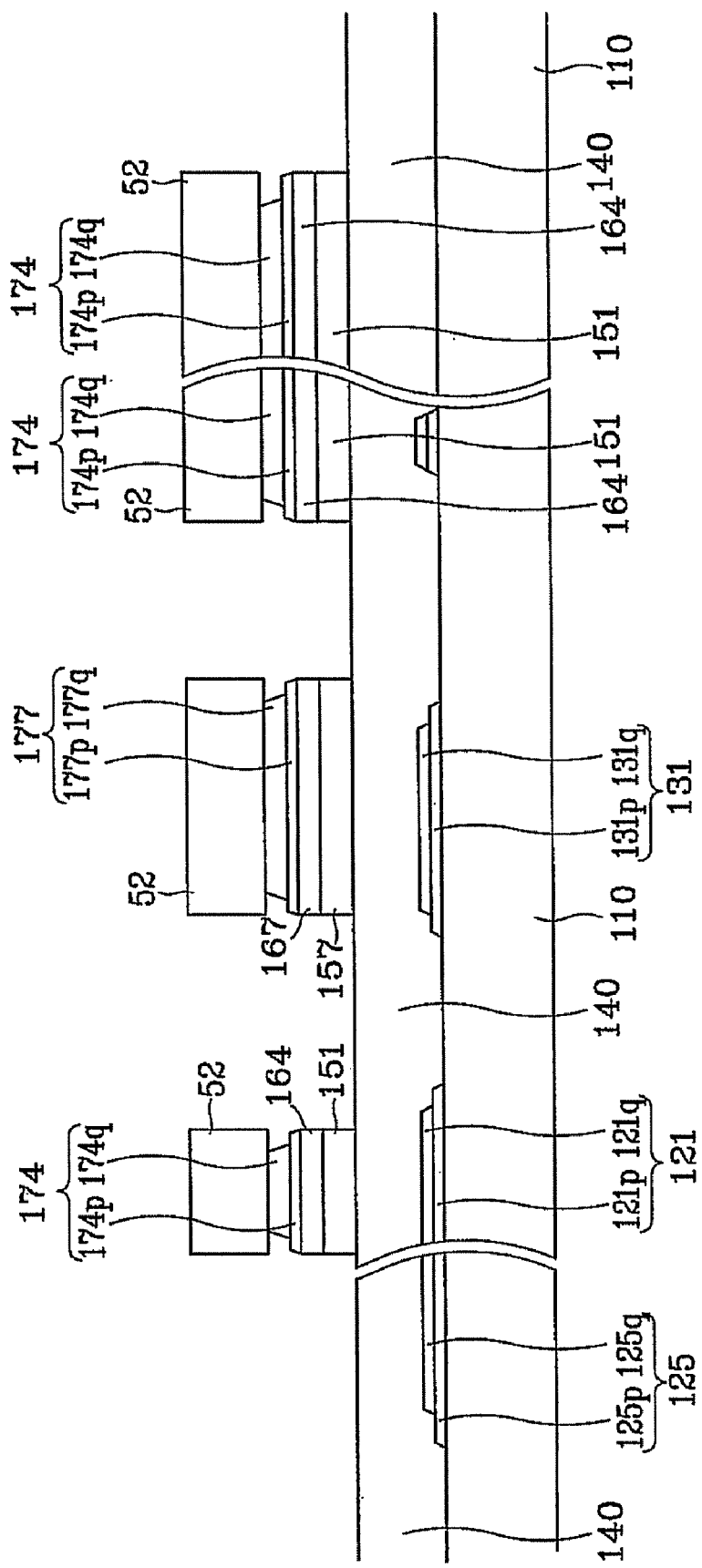
Figure 16B:
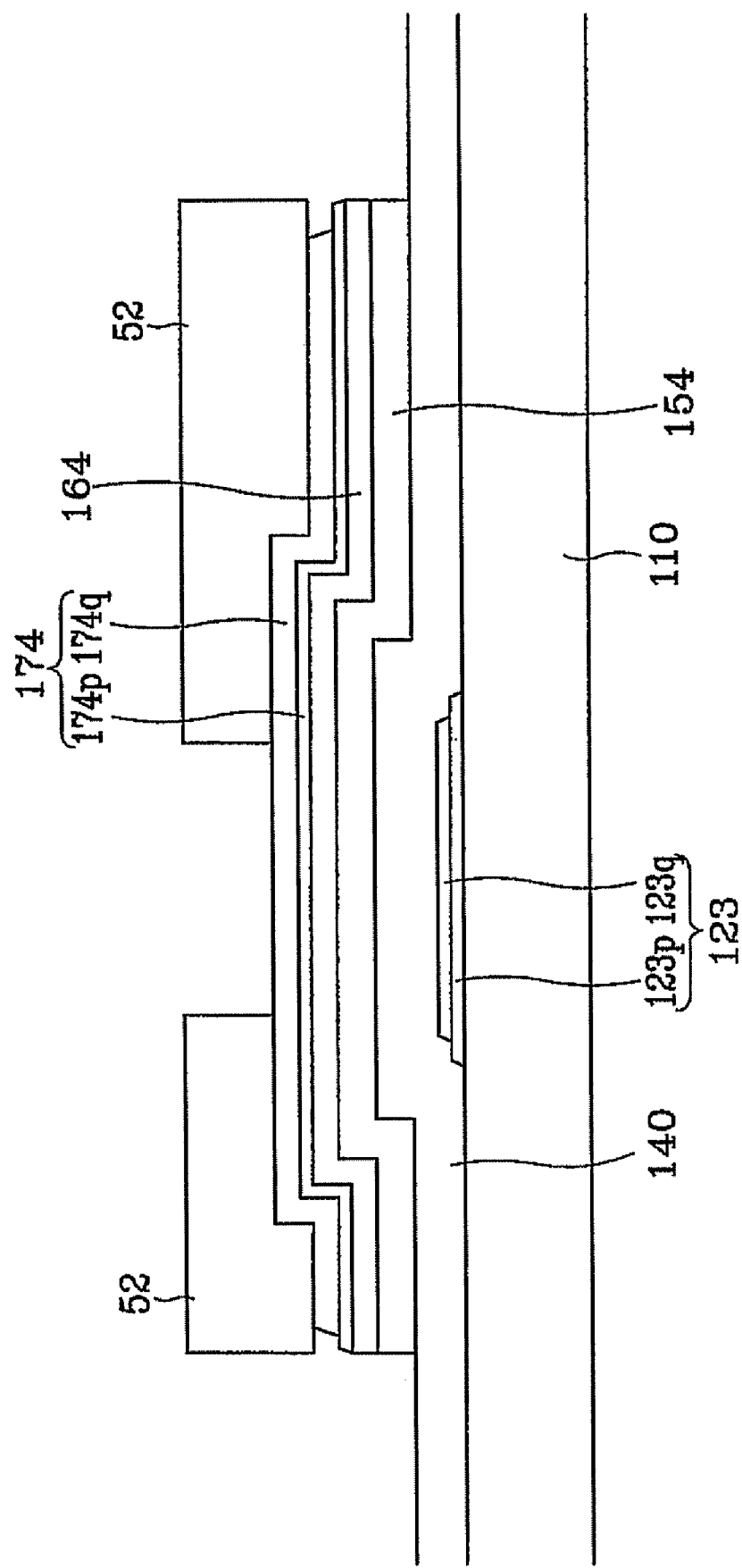

Referring to FIGS. 16A and 16B, the third portions of the extrinsic a-Si layer 160 on the areas B and of the intrinsic a-Si layer 150 are removed preferably by dry etching and the second portions 54 of the photoresist are removed to expose the second portions of the conductors 174. The removal of the second portions 54 of the photoresist are performed either simultaneously with or independent from the removal of the third portions of the extrinsic a-Si layer 160 and of the intrinsic a-Si layer 150. Residue of the second portions 54 of the photoresist remained on the channel areas C is removed by ashing.

The semiconductor stripes and islands 151 and 157 and the ohmic contact islands 167 are completed in this step, and reference numeral 164 indicates portions of the extrinsic a-Si layer 160 including the ohmic contact stripes and islands 161 and 165 connected to each other, which are called "extrinsic semiconductor stripes."

The lower film 170p of the conductive layer 170, the extrinsic a-Si layer 160, and the intrinsic a-Si layer 150 are dry-etched in sequence to simplify the manufacturing process. In this case, the dry etching of the three film and layers 170p, 160 and 150 may be performed in-situ in a single chamber.

The application of wet etching to the upper film 170q and of dry etching to the lower film 170p solves a problem that the sequential wet etching of the upper film 170q and the lower film 170p produces severe undercut to come off the photoresist, thereby obstructing subsequent etching.

Figure 17A:
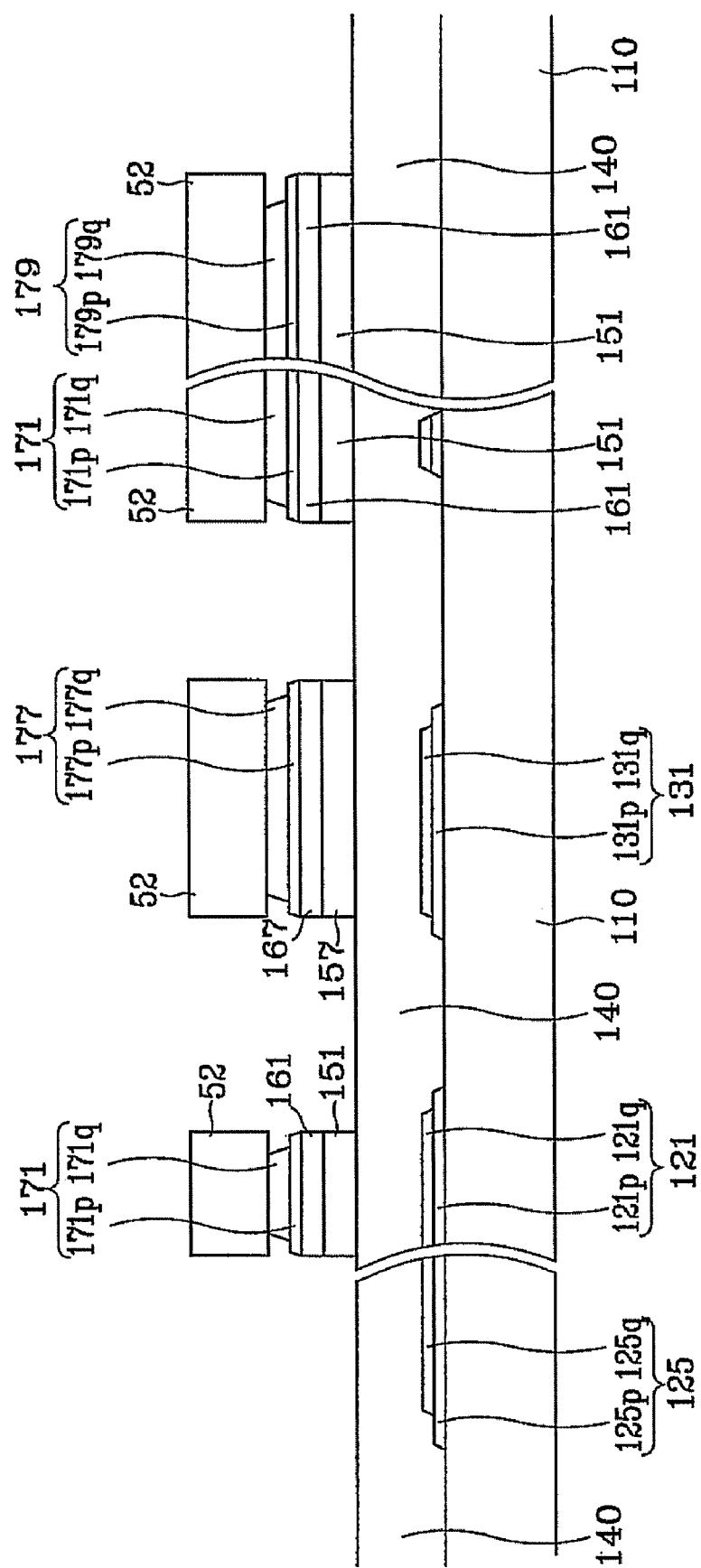
Figure 17B:
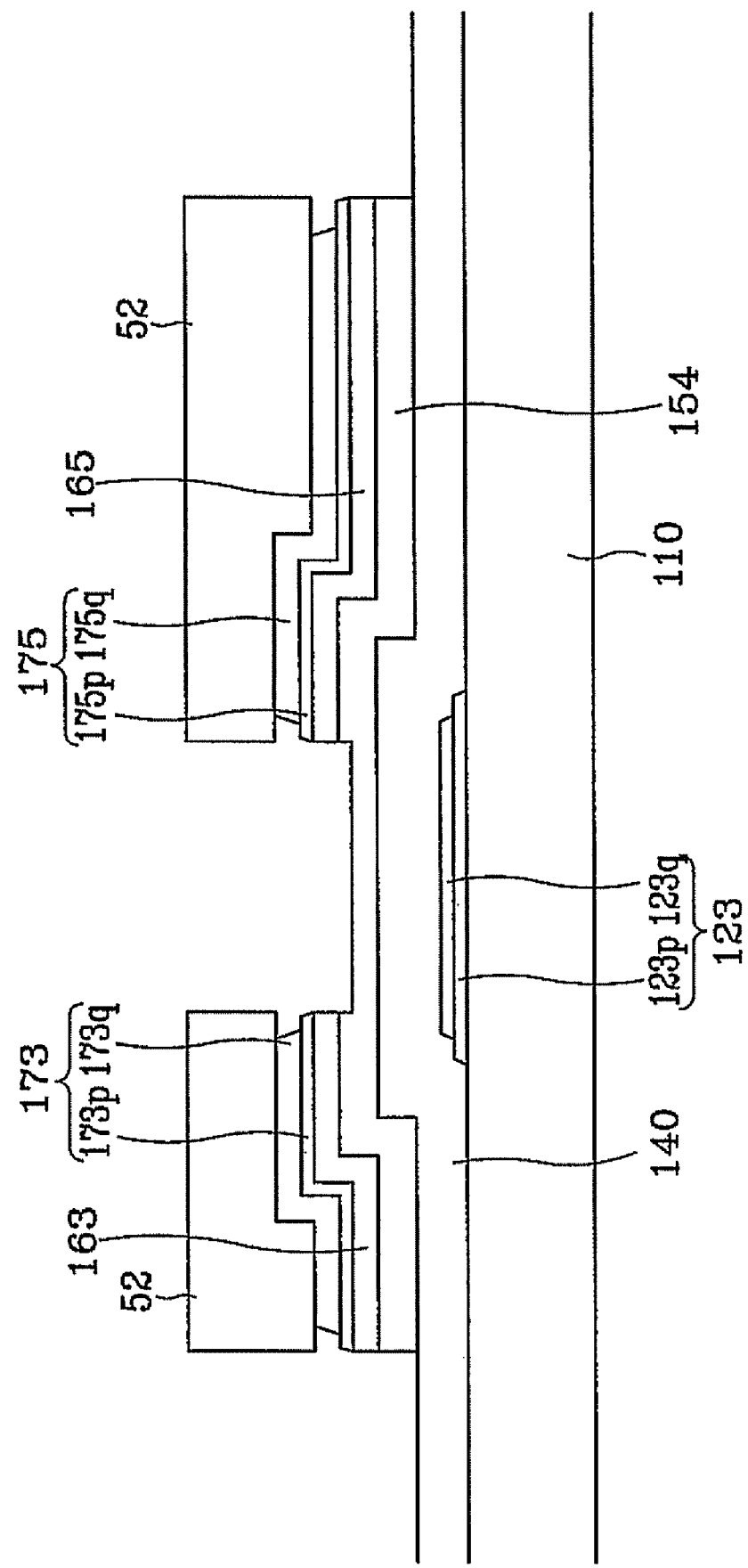
Figure 18A:
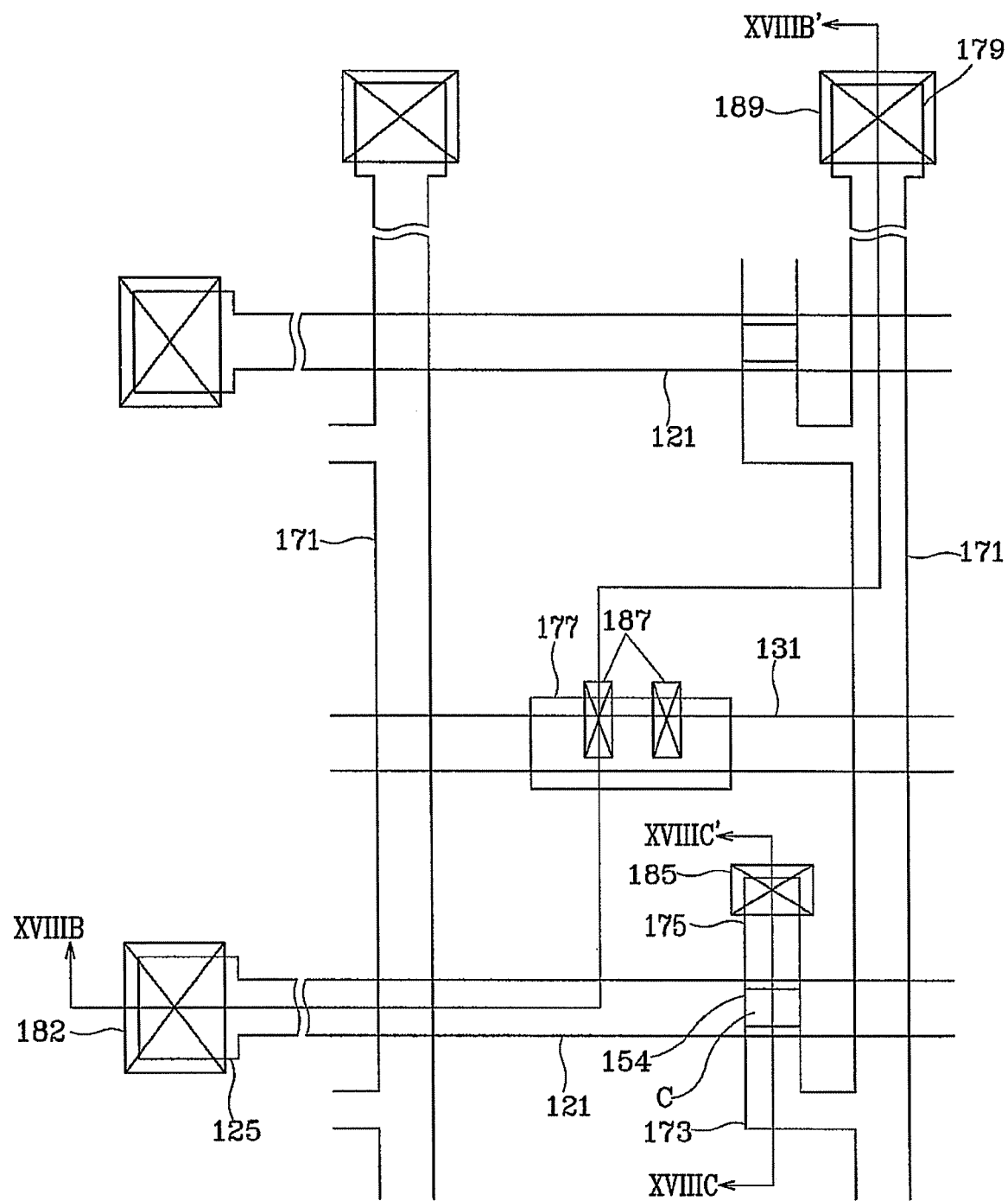
FIG. 18A is a layout view of a TFT array panel in the step following the step shown in FIGS. 17A and 17B.
Figure 18B:
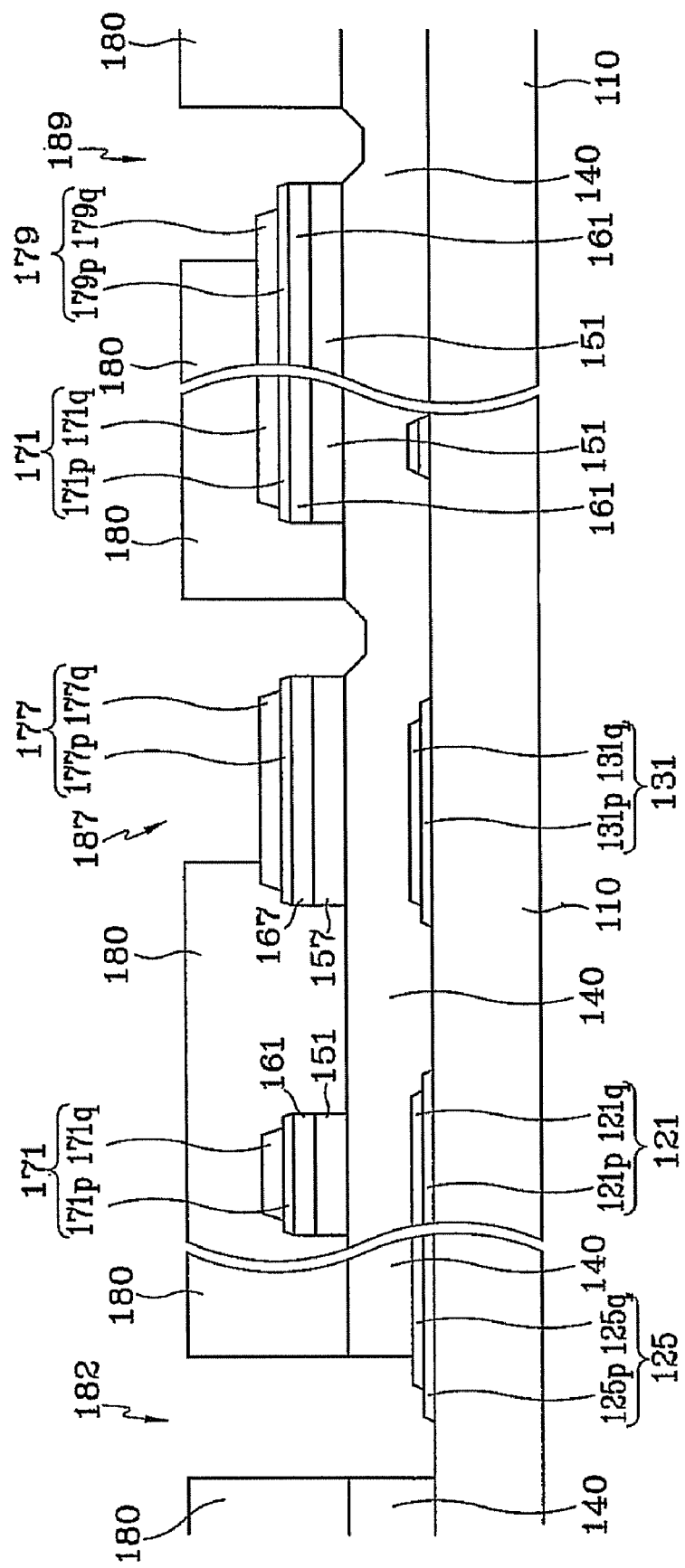
FIGS. 18B and 18C are sectional views of the TFT array panel shown in FIG. 18A taken along the lines XVIIIB-XVIIIB' and XVIIIC-XVIIIC', respectively.
Figure 18C:
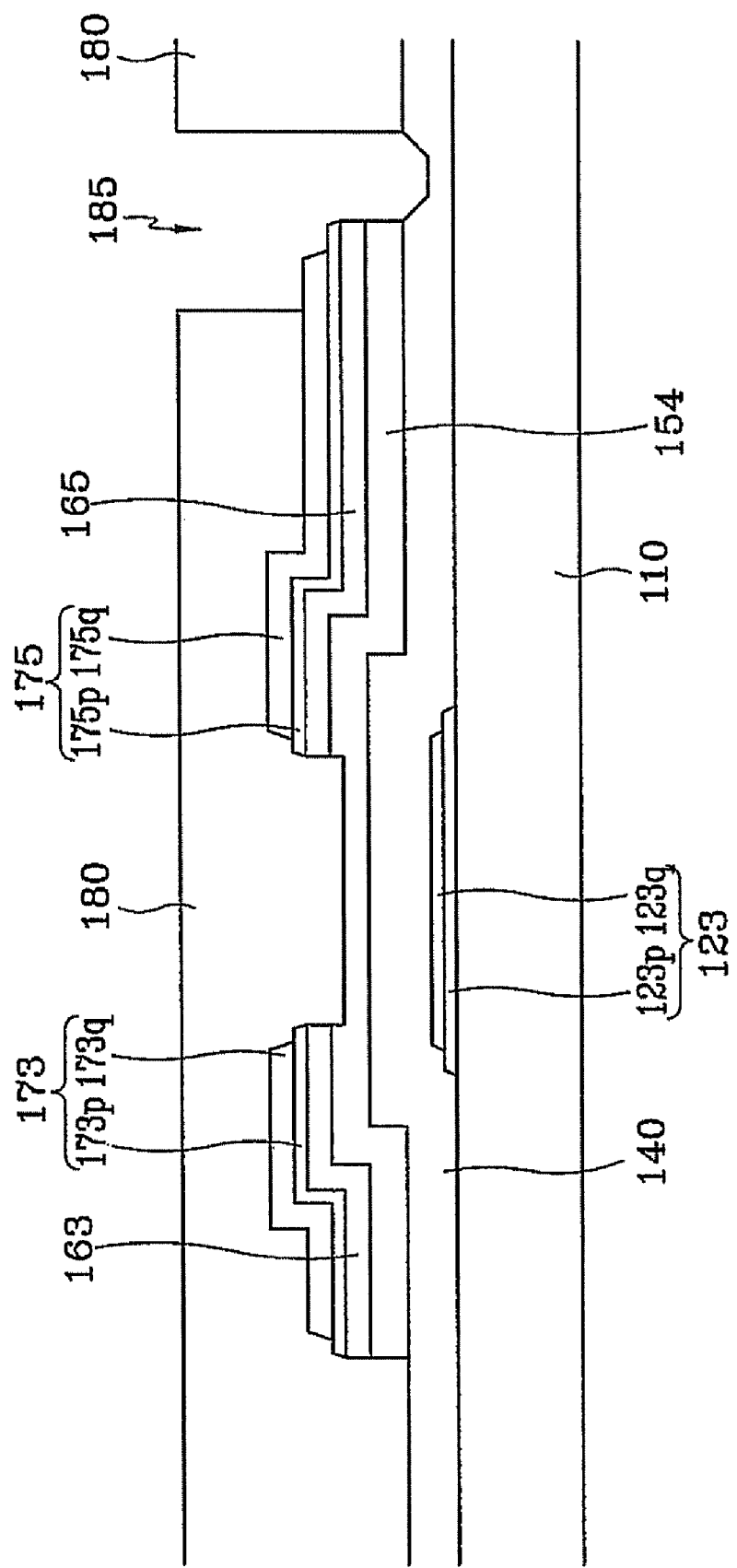

As shown in FIGS. 17A and 17B, the second portions of the conductors 174 and the extrinsic a-Si stripes 164 on the channel areas C as well as the first portion 52 of the photoresist are removed.

As shown in FIG. 17B, top portions of the projections 154 of the intrinsic semiconductor stripes 151 on the channel areas C may be removed to cause thickness reduction, and the first portions 52 of the photoresist are etched to a predetermined thickness.

Since the channel areas C have no contact between the conductive layer 170 and an overlying conductive layer(s), any etching sequence can be applicable to the second portions of the conductors 174 unlike the etching on the remaining areas B. For example, either any one of the wet etching and the dry etching can be applied to both the upper film 174q and the lower film 174q, or the wet etching is applied to any one of the two films 174p and 174q while the dry etching is the other of the two films 174p and 174q. However, since the dry etching of the lower film 174p may leave metal remnant on the extrinsic semiconductors 164 and the intrinsic semiconductors 151, which deteriorates the characteristics of the TFTs, the wet etching is preferred for the lower film 174p. Since the sequential wet etching of the two films 174q and 174p may come off the first portions 52 of the photoresist as described above, the removal of the first portions 52 is preferably performed before the removal of the lower film 174p and after the removal of the upper film 174q.

In this way, each conductor 174 is divided into a data line 171 and a plurality of drain electrodes 175 to be completed, and each extrinsic semiconductor stripe 164 is divided into an ohmic contact stripe 161 and a plurality of ohmic contact islands 165 to be completed.

Next, a passivation layer 180 is formed by chemical-vapor-depositing silicon nitride at a temperature in a range of about 250-1500° C., by growing low dielectric material such as a-Si:C:O or a-Si:O:F, by CVD of silicon nitride, or by coating an organic insulating material such as acryl-based material having a good planarization characteristic. Referring to FIGS. 18A and 18B, the passivation layer 180 as well as the gate insulating layer 140 is photo-etched to form a plurality of contact holes 182, 185, 187 and 189.

Finally, as shown in FIGS. 9 to 11, an IZO layer with a thickness in a range between about 500 Å and about 1,500 Å is sputtered and photo-etched to form a plurality of pixel electrodes 190 and a plurality of contact assistants 92 and 97. The etching of the IZO layer preferably includes wet etching using a Cr etchant of $HNO_3/(NH_4)_2Ce(NO_3)_6/H_2O$, which does not erode Al of the data lines 171, the drain electrodes 175, and the storage capacitor conductors 177.

This embodiment simplifies the manufacturing process by forming the data lines 171, the drain electrodes 175, and the storage capacitor conductors 177 as well as the ohmic contacts 161, 165 and 167 and the semiconductor stripes and islands 151 and 157 using a single photolithography step.

A TFT array panel for an LCD according to another embodiment of the present invention will be described in detail with reference to FIGS. 19 and 20.

Figure 19:
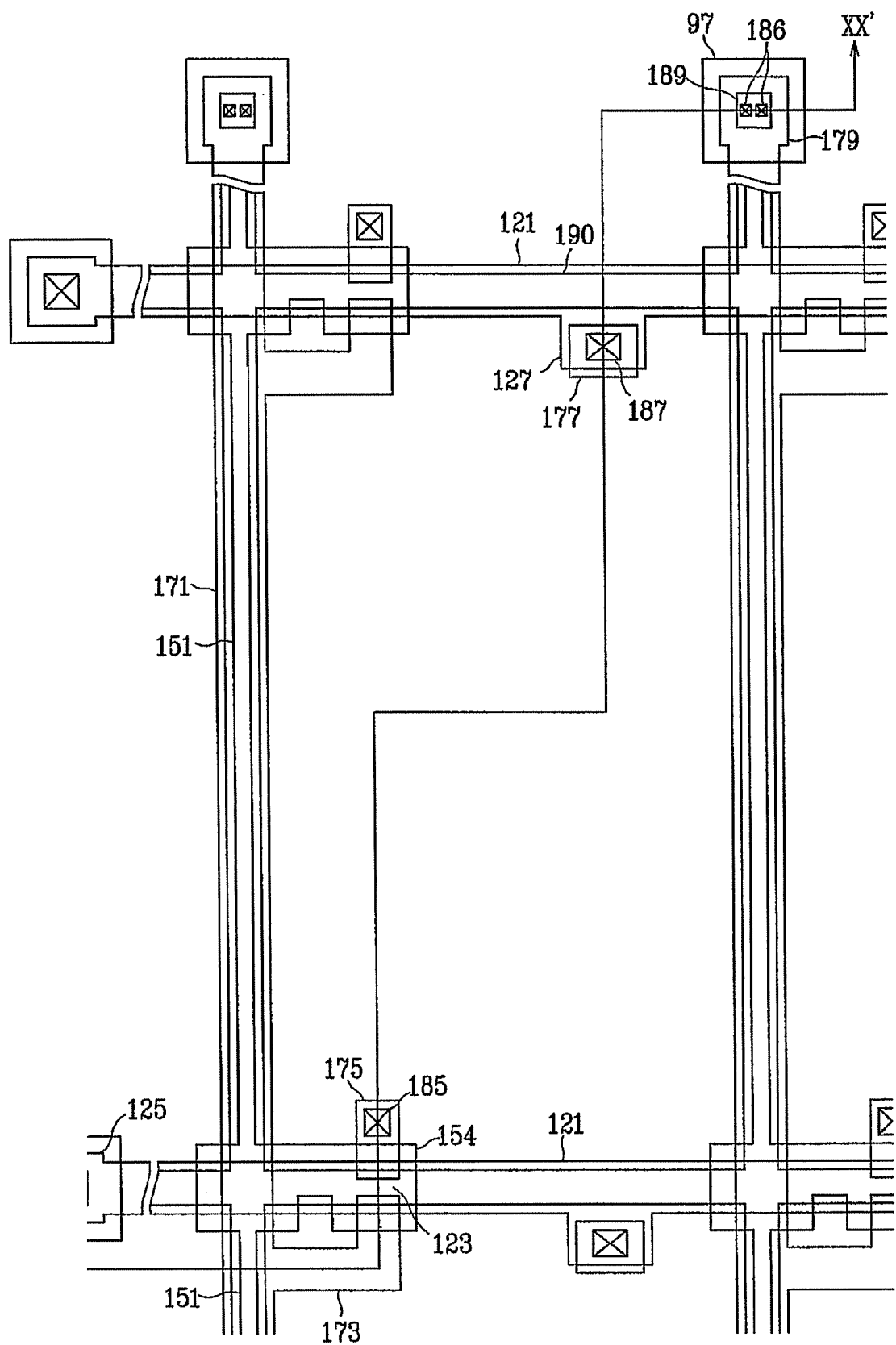
FIG. 19 is a layout view of an exemplary TFT array panel for an LCD according to another embodiment of the present invention.
Figure 20:
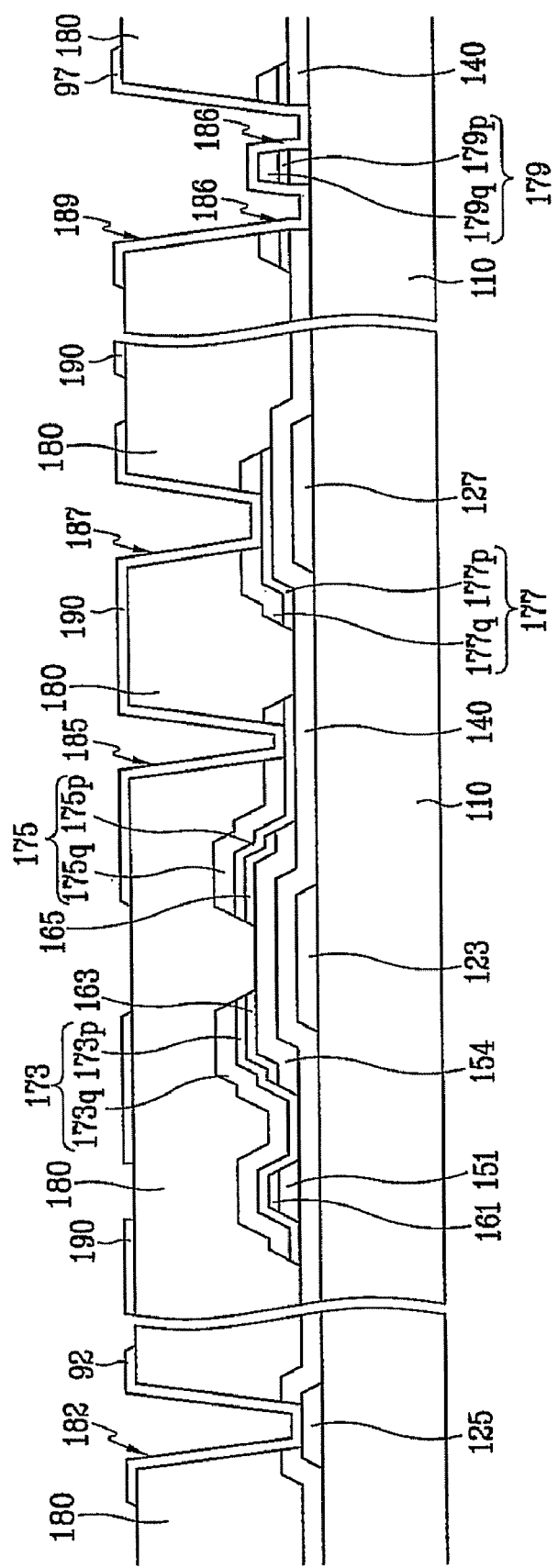
FIG. 20 is a sectional view of the TFT array panel shown in FIG. 19 taken along the line XX-XX'.

FIG. 19 is a layout view of an exemplary TFT array panel for an LCD according to another embodiment of the present invention, and FIG. 20 is a sectional view of the TFT array panel shown in FIG. 19 taken along the line XX-XX'.

As shown in FIGS. 19 and 20, a layered structure of a TFT array panel of an LCD according to this embodiment is almost the same as that shown in FIGS. 3 and 4. That is, a plurality of gate lines 121 including a plurality of gate electrodes 123 and a plurality of expansions 127 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173, a plurality of drain electrodes 175, and a plurality of storage capacitor conductors 177 are formed on the ohmic contacts 161 and 165 and the gate insulating layer 140, and a passivation layer 180 is formed thereon. A plurality of contact holes 182, 185, 187 and 189 are provided at the passivation layer 180 and/or the gate insulating layer 140, and a plurality of pixel electrodes 190 and a plurality of contact assistants 92 and 97 are formed on the passivation layer 180.

Different from the TFT array panel shown in FIGS. 3 and 4, the gate lines 121 in the TFT array panel according to this embodiment include a single film. In addition, the contact holes 182, 185, 187 and 189 exposing end portions 125 of the gate lines, the drain electrodes 175, the storage capacitor conductors 177, and end portions 179 of the data lines 171 expose no edge thereof. The end portion 179 of each data line 171 has two trenches 186 extending downward to the substrate 110.

The number of the trenches 186 is not fixed and the shapes of the trenches 186 can be modified into any shapes such as rectangles.

The contact assistants 97 located at the contact holes 189 extend along the surfaces of the trenches 186 to have unevenness. The unevenness gives large friction to probe tips contacting the contact assistants 97 for gross test, thereby preventing sliding of the tips. The gross test examines disconnection of signal lines such as the gate lines 121 and the data lines 171 and failure of the TFTs after completion of the TFT array panel by contacting the probe tips with the contact assistants 92 and 97 and then applying test signals thereto.

A method of manufacturing the TFT array panel shown in FIGS. 19 and 20 according to an embodiment of the present invention will be now described in detail with reference to FIGS. 21A to 22B as well as FIGS. 19 and 20.

Figure 21A:
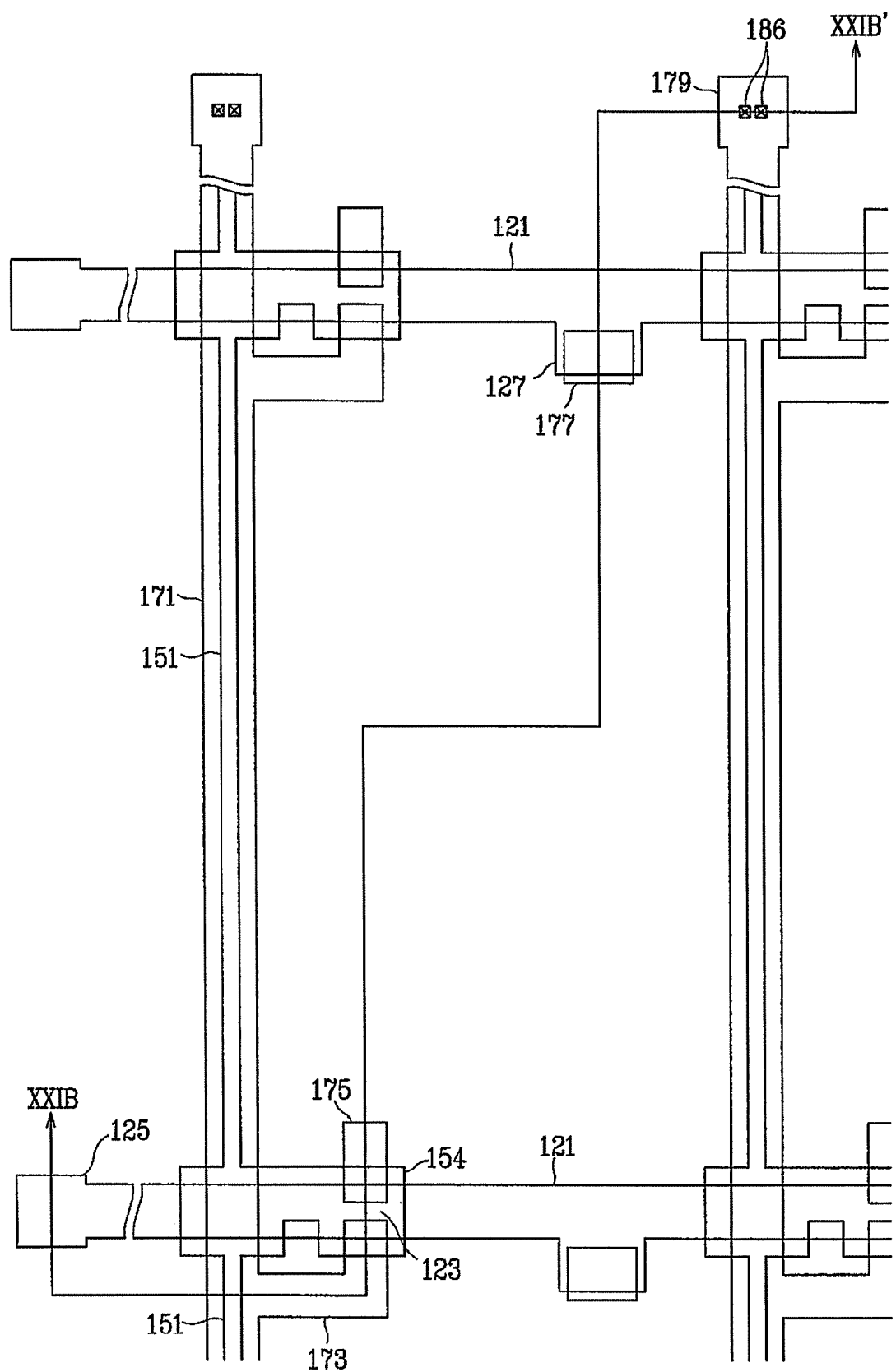
FIGS. 21A and 22A are layout views of the TFT array panel shown in FIGS. 19 and 20 in intermediate steps of a manufacturing method thereof according to an embodiment of the present invention.
Figure 21B:
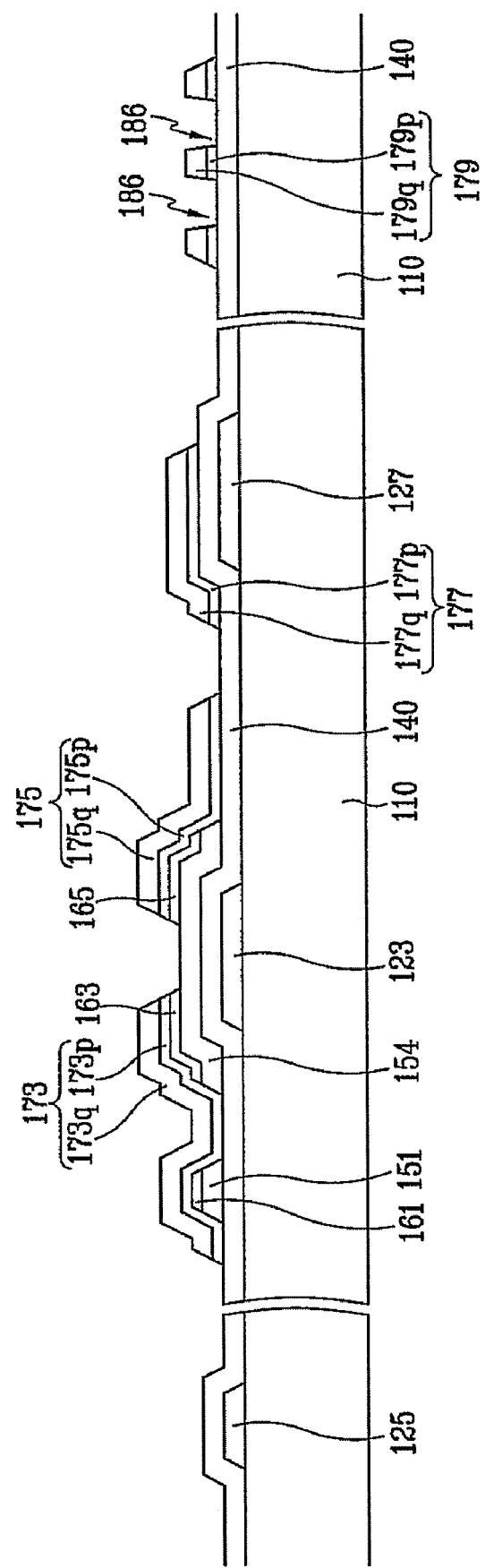
FIGS. 21B and 22B are sectional views of the TFT array panel shown in FIGS. 21A and 22A taken along the lines XXIB-XXIB' and XXIIB-XXIIB', respectively.
Figure 22A:
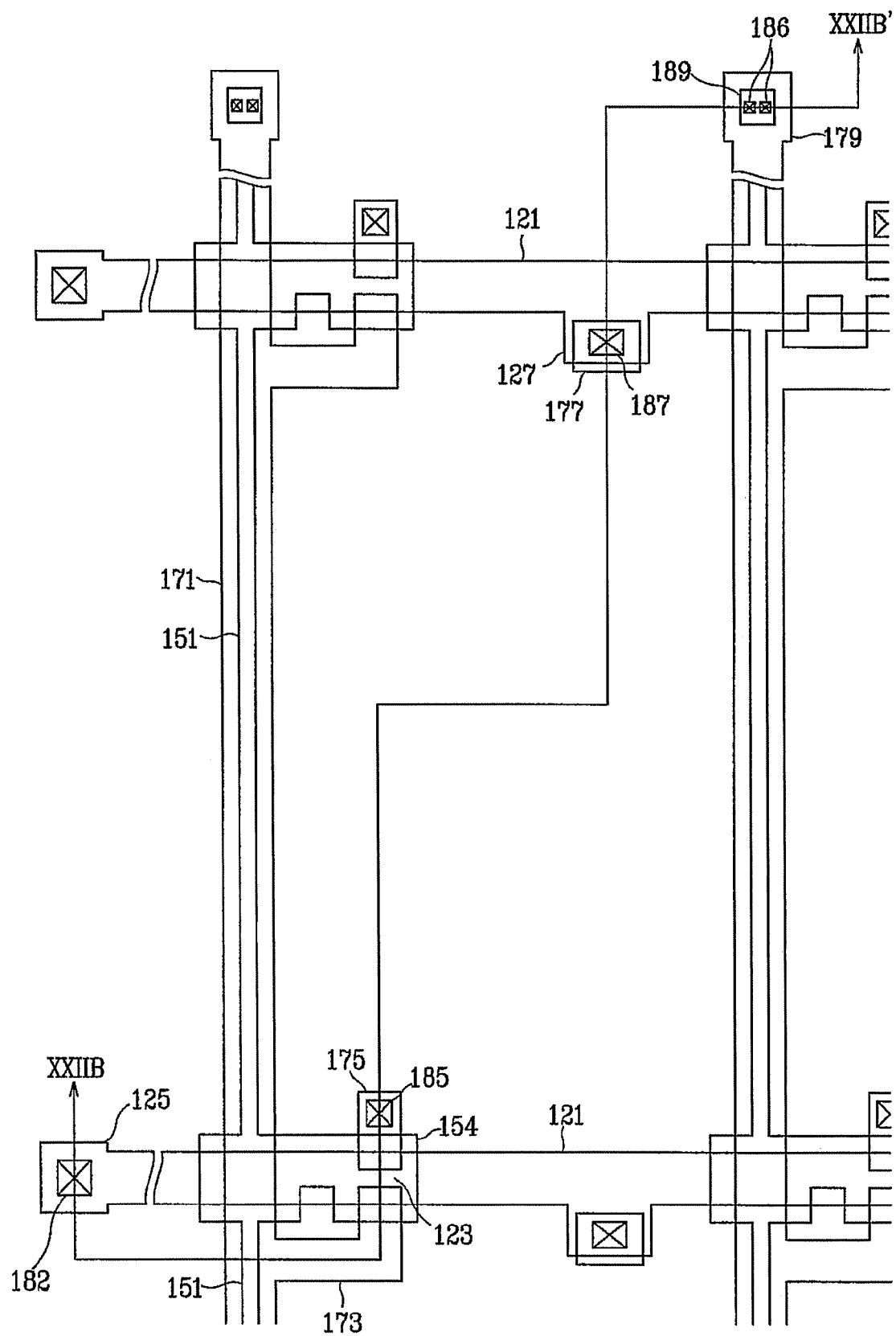
Figure 22B:
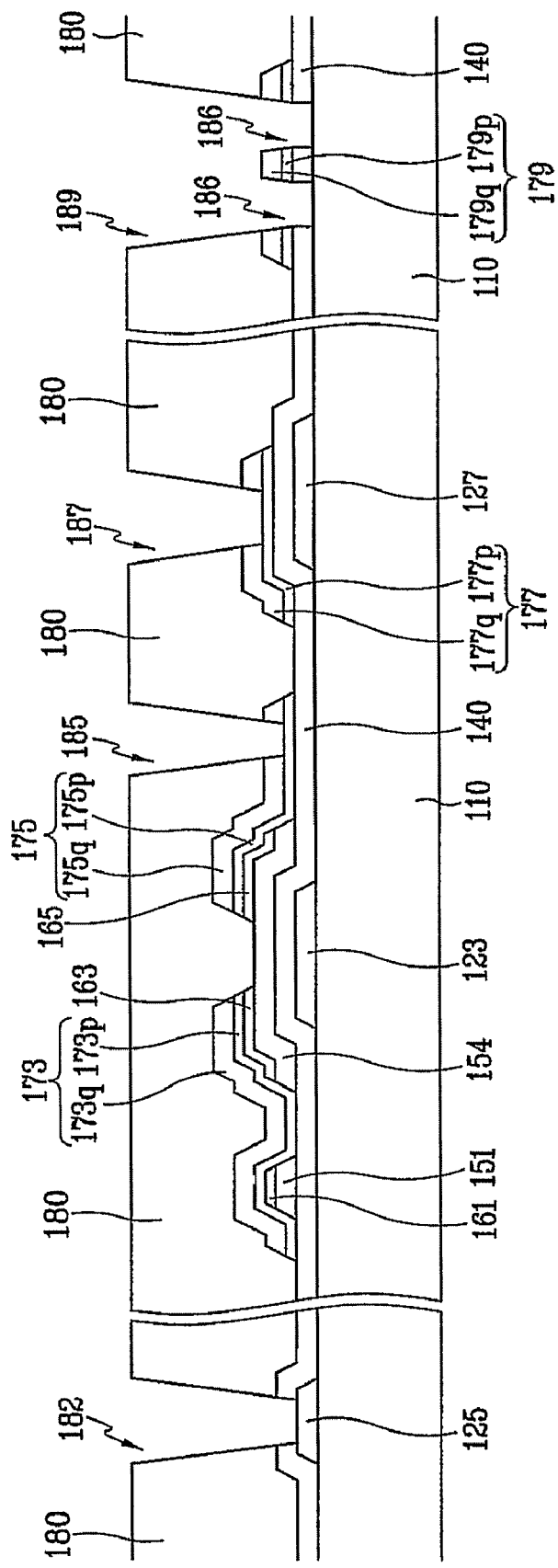

FIGS. 21A and 22A are layout views of the TFT array panel shown in FIGS. 19 and 20 in intermediate steps of a manufacturing method thereof according to an embodiment of the present invention, and FIGS. 21B and 22B are sectional views of the TFT array panel shown in FIGS. 21A and 22A taken along the lines XXIB-XXB' and XXIIB-XXIIB', respectively Referring to FIGS. 21A and 21B, a plurality of gate lines 121 including a plurality of gate electrodes 123 and a plurality of expansions 127 are formed on a transparent insulating substrate 110, a gate insulating layer 140 is formed thereon, and a plurality of intrinsic semiconductor stripes 151 including a plurality of projections 154 and a plurality of extrinsic semiconductor stripes 164 are formed on the gate insulating layer 140. After forming a plurality of data lines 171 including a plurality of source electrodes 173, a plurality of drain electrodes 175, and a plurality of storage capacitor conductors 177, portions of the extrinsic semiconductor stripes 164, which are not covered with the data lines 171, the drain electrodes 175, and the storage capacitor conductors 177, are removed to complete a plurality of ohmic contact stripes 161 including a plurality of projections 163 and a plurality of ohmic contact islands 165 and to expose portions of the intrinsic semiconductor stripes 151. Two trenches 168 are provided at an end portion 179 of each data line 171 to expose portions of the gate insulating layer 140.

Referring to FIGS. 22A and 22B, after depositing a passivation layer 180, the passivation layer 180 and the gate insulating layer 140 are photo-etched to form a plurality of contact holes 182, 185, 187 and 189 exposing end portions 125 of the gate lines 121, the drain electrodes 175, the storage capacitor conductors 177, and end portions 179 of the data lines 171, respectively. The contact holes 189 expose the trenches 186 at least in part. Figures show that the contact holes 189 are large enough to expose edges of the trenches 186. The exposed portions of the gate insulating layer 140 in the trenches 186 are removed in this step.

Finally, a plurality of pixel electrodes 190 and a plurality of contact assistants 92 and 97 are formed on the passivation layer 180 as shown in FIGS. 19 and 20.

Figure 23:
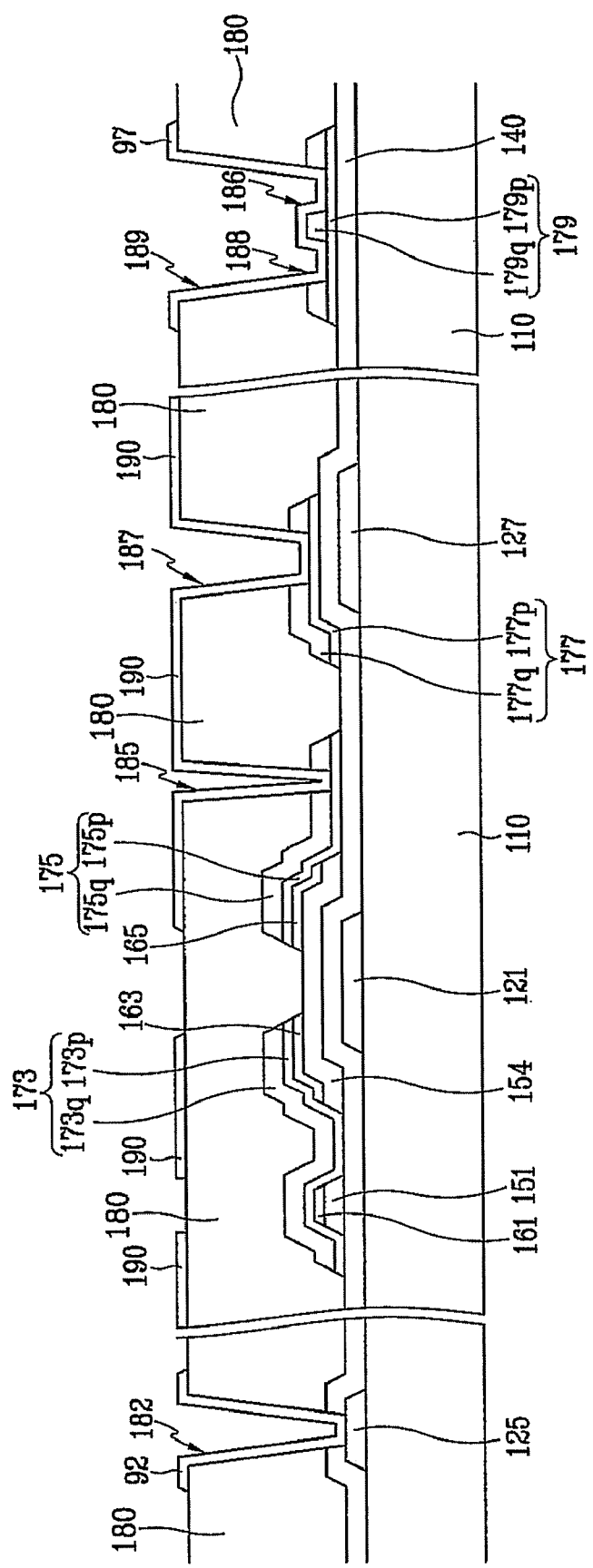
FIG. 23 is a sectional view of a TFT array panel according to another embodiment of the present invention.

FIG. 23 is a sectional view of the TFT array panel shown in FIG. 19 according to another embodiment of the present invention.

As shown in FIG. 23, a layered structure of a TFT array panel of an LCD according to this embodiment is almost the same as that shown in FIG. 20. However, unlike the TFT array panel shown in FIG. 20, the trenches 186 are provided only at the upper film 179q of the end portions 179 of the data lines 179.

Methods of manufacturing the TFT array panel shown in FIG. 23 according to embodiments of the present invention will be described in detail with reference to FIGS. 24A-25B.

Figure 24A:
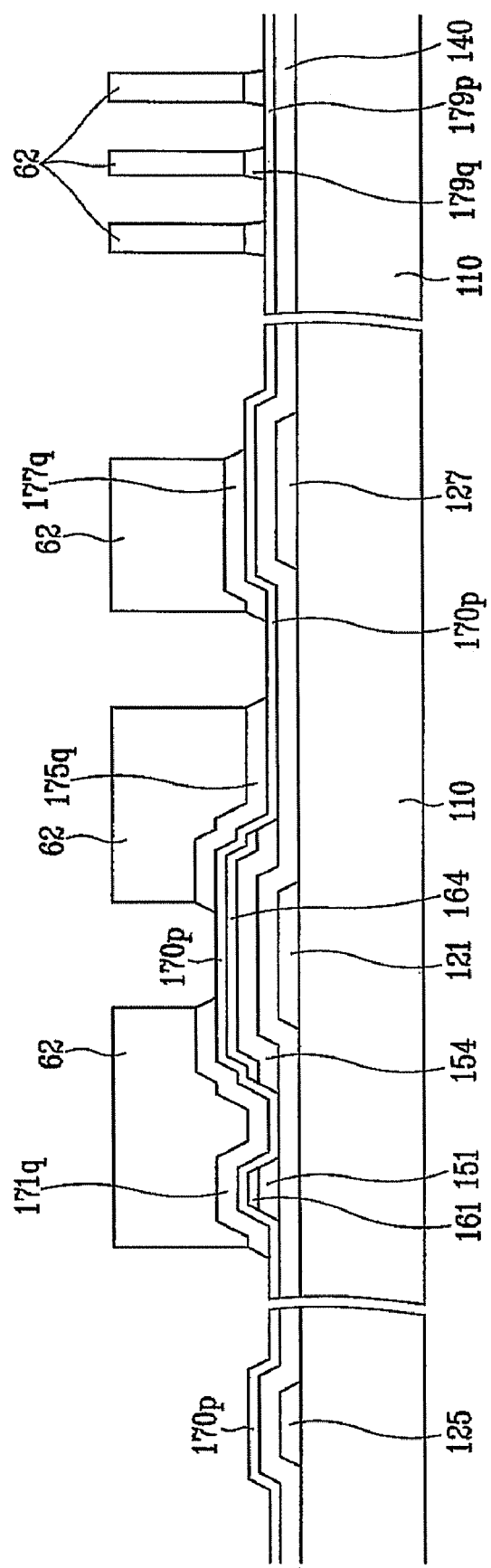
FIGS. 24A and 24B are sectional views of the TFT array panel shown in FIG. 23 in intermediate steps of a manufacturing method thereof according to an embodiment of the present invention.
Figure 24B:
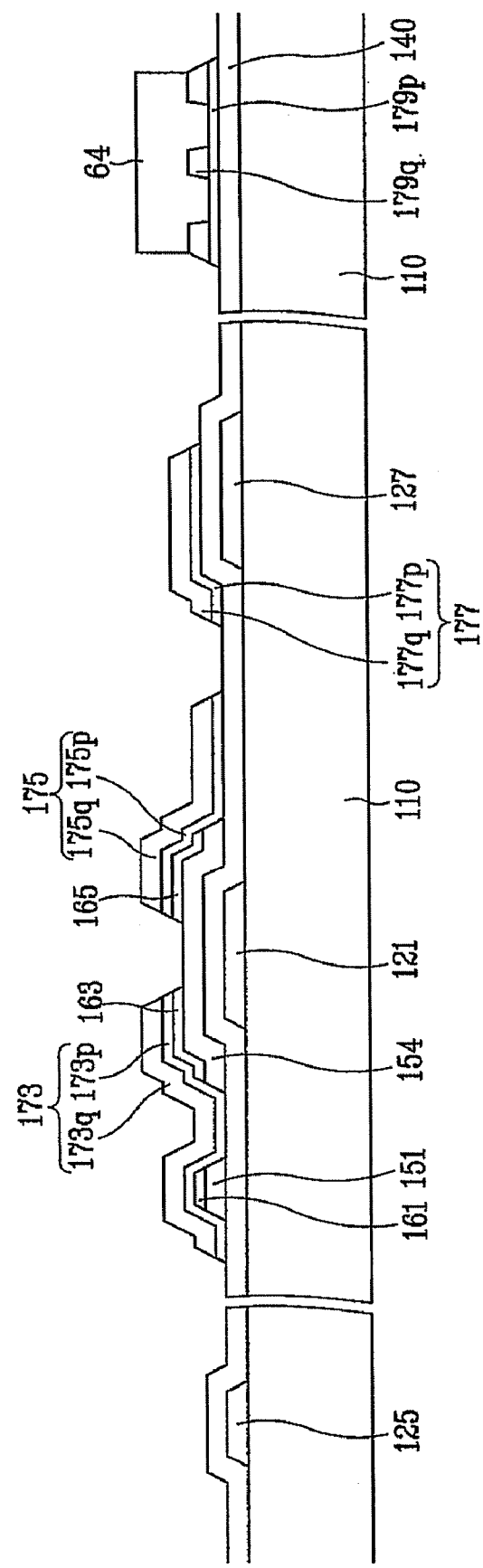
Figure 25A:
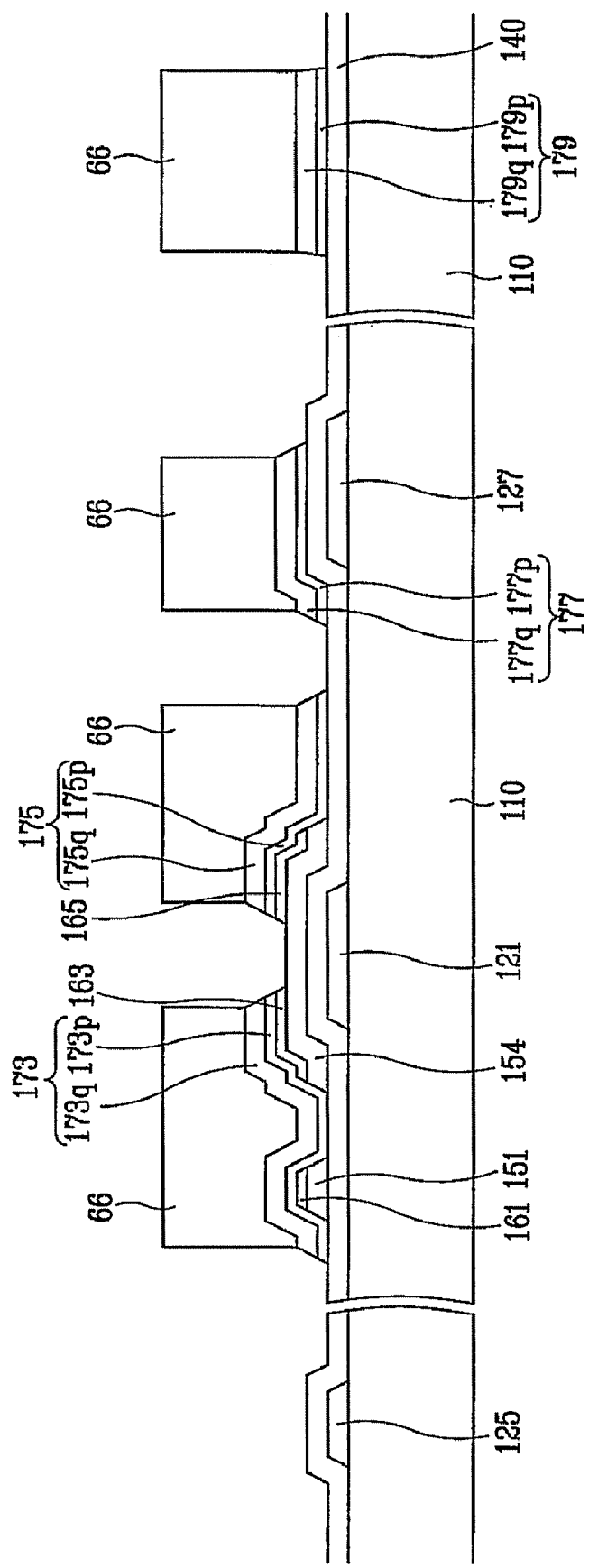
FIGS. 25A and 25B are sectional views of the TFT array panel shown in FIG. 23 in intermediate steps of a manufacturing method thereof according to another embodiment of the present invention.
Figure 25B:
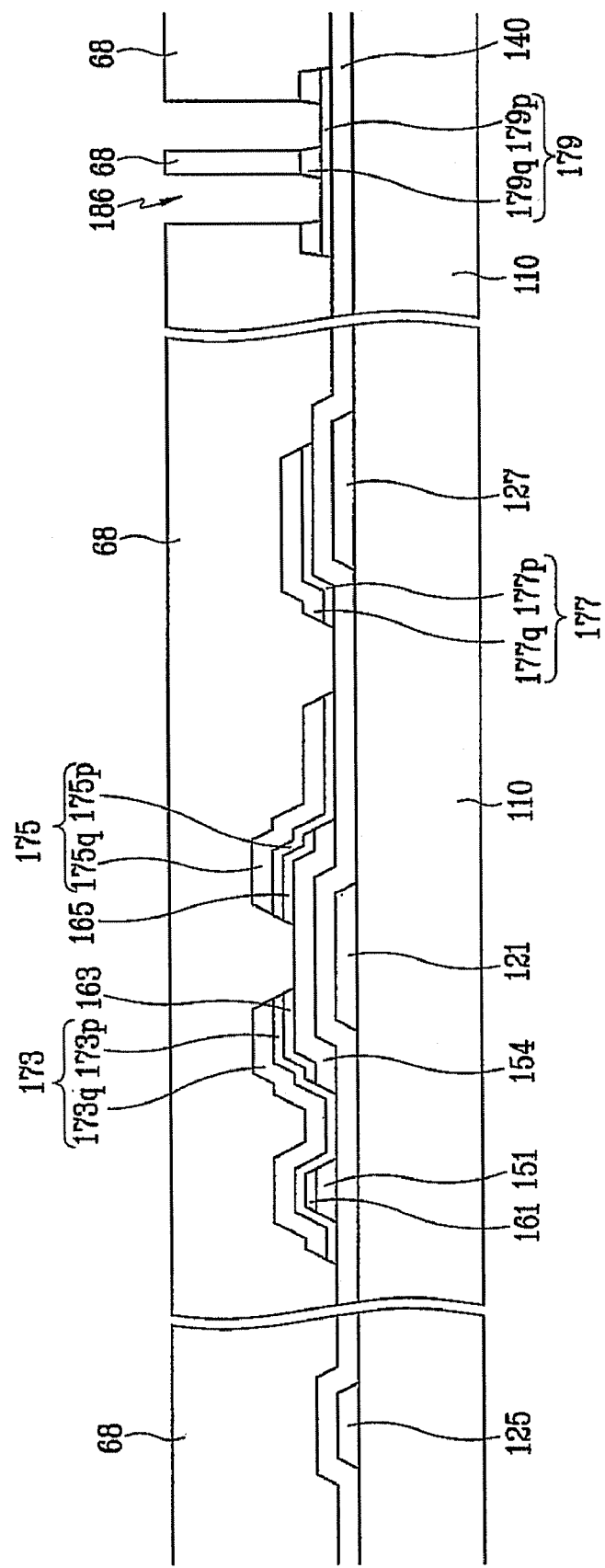

FIGS. 24A and 24B are sectional views of the TFT array panel shown in FIG. 23 in intermediate steps of a manufacturing method thereof according to an embodiment of the present invention, and FIGS. 25A and 25B are sectional views of the TFT array panel shown in FIG. 23 in intermediate steps of a manufacturing method thereof according to another embodiment of the present invention.

Referring to FIGS. 24A and 25A, a plurality of gate lines 121 including a plurality of gate electrodes 123 and a plurality of expansions 127, a gate insulating layer 140, a plurality of intrinsic semiconductor stripes 151 including a plurality of projections 154, and a plurality of extrinsic semiconductor stripes 164 are sequentially formed on an insulating substrate 110, and a lower conductive film and an upper conductive film are deposited in sequence.

According to the embodiment shown in FIGS. 24A and 24B, a photoresist 62 having patterns of trenches 186 are formed on the upper film as shown in FIG. 24A. The upper film is etched using the photoresist 62 as an etch mask to form an upper film 171q, 175q and 175q of a plurality of data lines 171 including a plurality of source electrodes 173, a plurality of drain electrodes 175, and a plurality of storage capacitor conductors 177 and the photoresist 62 is then removed. A photoresist 64 covering the trenches 186 on end portions 179 of the data lines 171 are formed, and the lower film is etched using the photoresist 64 and the upper film 171q, 175q and 175q as an etch mask to complete the data lines 171, the drain electrodes 175, and the storage capacitor conductors 177.

Subsequently, exposed portions of the extrinsic semiconductor stripes 164 and the photoresist 64 are removed.

According to the embodiment shown in FIGS. 25A and 25B, after forming a photoresist 66 without patterns of trenches 186 on the upper film, the upper film and the lower film are etched in turn or simultaneously using the photoresist 62 as an etch mask, and exposed portions of the extrinsic semiconductor stripes 164 and the photoresist 66 are removed as shown in FIG. 25A. Referring to FIG. 25B, after forming a photoresist 68 having patterns of trenches 186, the upper film 171q, 175q and 175q is etched using the photoresist 68 as an etch mask to form the trenches 186 and the photoresist 68 is removed.

Finally, after depositing a passivation layer 180, the passivation layer 180 and the gate insulating layer 140 are photo-etched to form a plurality of contact holes 182, 185, 187 and 189 and a plurality of pixel electrodes 190 and a plurality of contact assistants 92 and 97 are formed on the passivation layer 180 as shown in FIG. 23.

Alternatively, the storage capacitor conductors 177 include only the lower film 177p. In this case, the photoresist 62 shown in FIG. 24A does not cover the storage capacitor conductors 177 while the photoresist 64 shown in FIG. 24B covers the storage capacitor conductors 177 according to the embodiment shown in FIGS. 24A and 24B. On the contrary, the photoresist 68 shown in FIG. 25B does not cover the storage capacitor conductors 177 according to the embodiment shown in FIGS. 25A and 25B.

A photoresist having a position-dependent thickness may be used for patterning of both the upper film and the lower film. The photoresist is the thickest on the data lines 171, the drain electrodes 175, and the storage capacitor conductors 177, is the next thickest on the trenches, and the thinnest or has zero thickness on the remaining portions.

Figure 26:
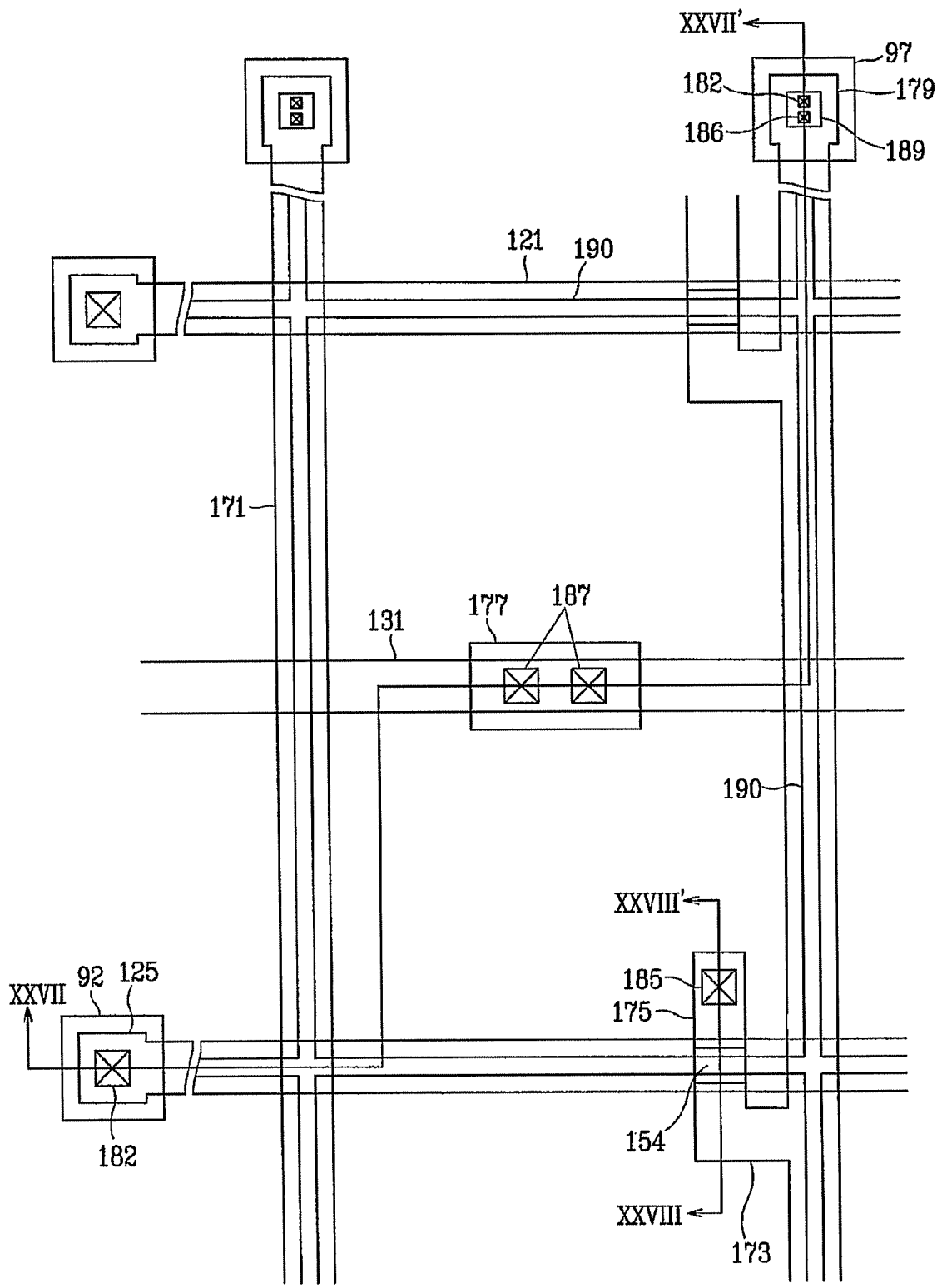
FIG. 26 is a layout view of an exemplary TFT array panel for an LCD according to another embodiment of the present invention.
Figure 27:
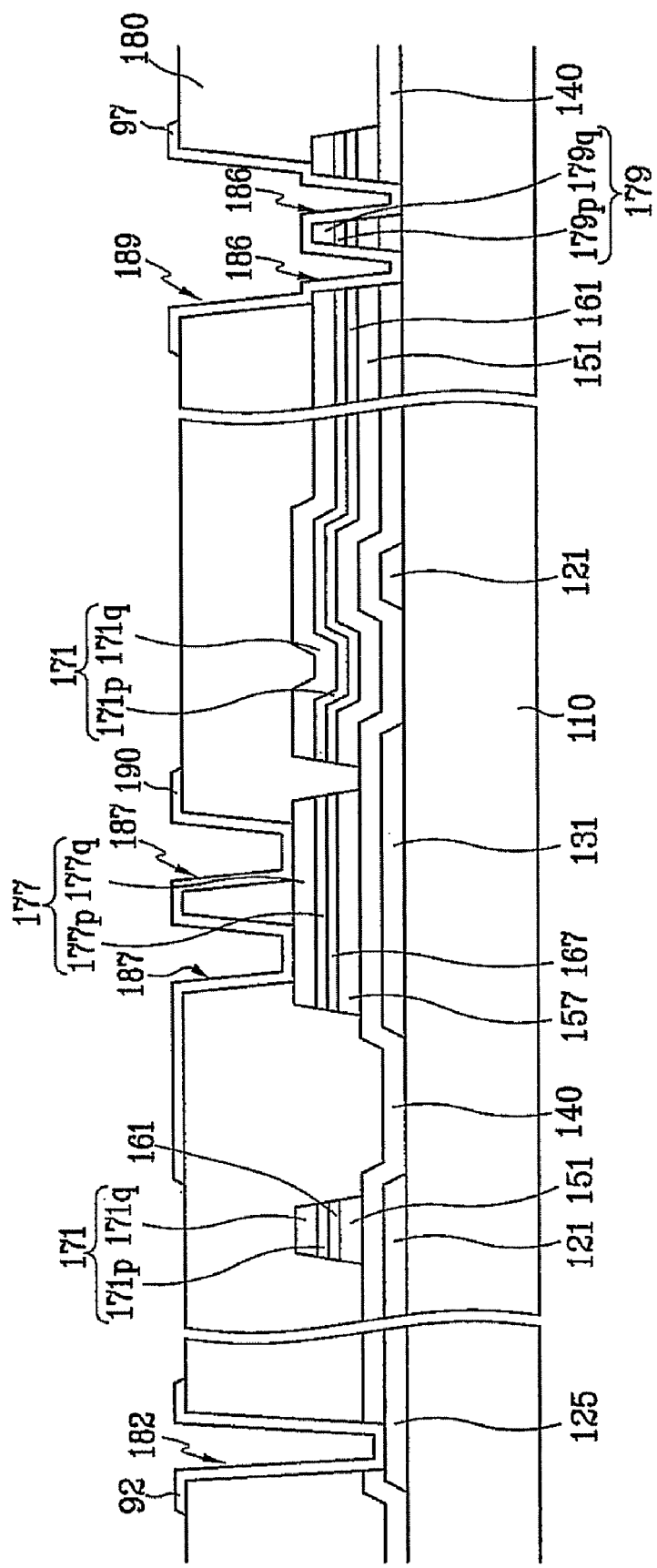
FIGS. 27 and 28 are sectional views of the TFT array panel shown in FIG. 26 taken along the lines XXVII-XXVII' and XXVIII-XXVIII', respectively.
Figure 28:
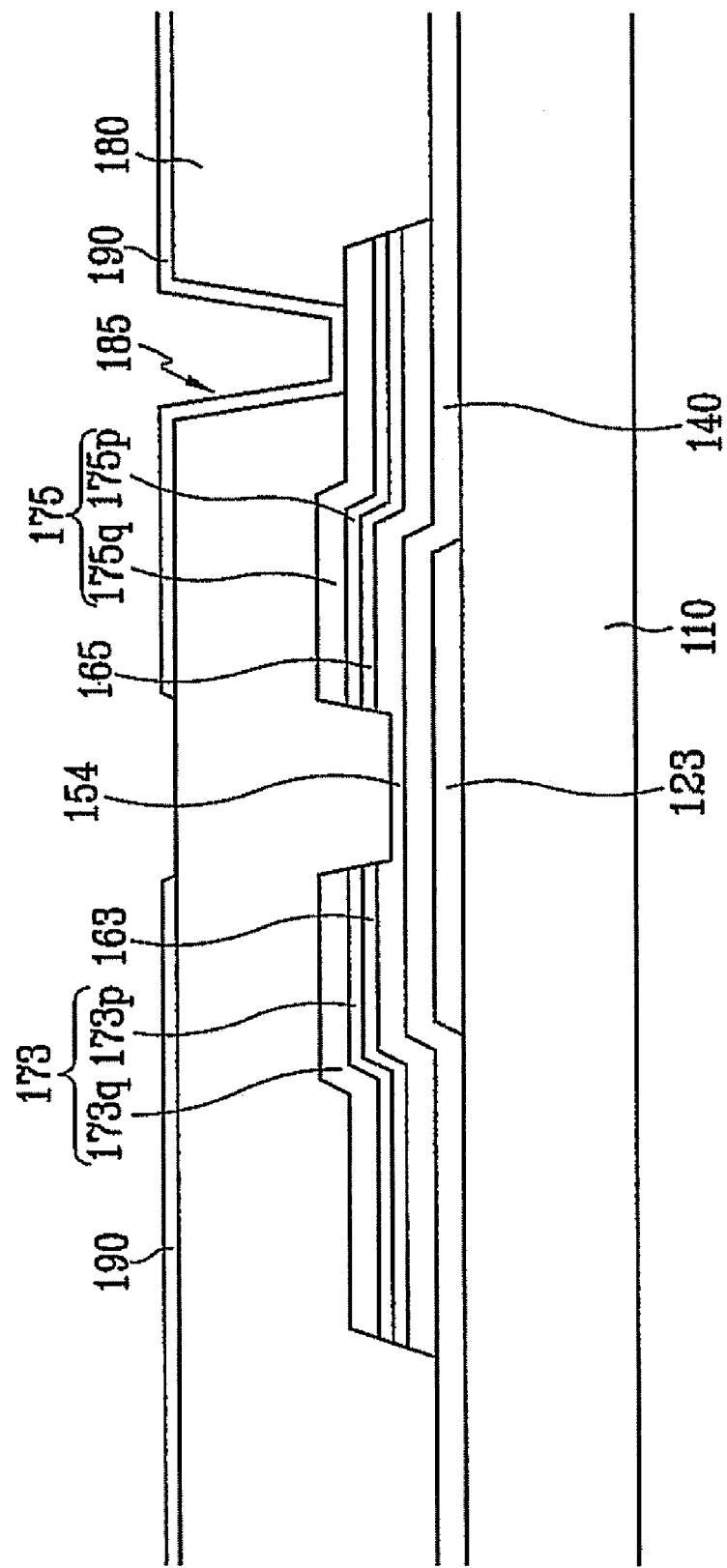

FIG. 26 is a layout view of an exemplary TFT array panel for an LCD according to another embodiment of the present invention, and FIGS. 27 and 28 are sectional views of the TFT array panel shown in FIG. 26 taken along the lines XXVII-XXVII' and XXVIII-XXVIII', respectively.

As shown in FIGS. 26-28, a layered structure of a TFT array panel of an LCD according to this embodiment is almost the same as that shown in FIGS. 9-11. That is, a plurality of gate lines 121 including a plurality of gate electrodes 123 and a plurality of storage electrodes lines 131 are formed on a substrate 110, and a gate insulating layer 140, a plurality of semiconductor stripes 151 including a plurality of projections 154 and a plurality of semiconductor islands 157, and a plurality of ohmic contact stripes 161 including a plurality of projections 163 and a plurality of ohmic contact islands 165 and 167 are sequentially formed thereon. A plurality of data lines 171 including a plurality of source electrodes 173, a plurality of drain electrodes 175, and a plurality of storage capacitor conductors 177 are formed on the ohmic contacts 161, 165 and 167, and a passivation layer 180 is formed thereon. A plurality of contact holes 182, 185, 187 and 189 are provided at the passivation layer 180 and/or the gate insulating layer 140, and a plurality of pixel electrodes 190 and a plurality of contact assistants 92 and 97 are formed on the passivation layer 180.

Different from the TFT array panel shown in FIGS. 9-11, the gate lines 121 in the TFT array panel according to this embodiment include a single film. In addition, the contact holes 182, 185, 187 and 189 exposing end portions 125 of the gate lines, the drain electrodes 175, the storage capacitor conductors 177, and end portions 179 of the data lines 171 expose no edge thereof. The end portion 179 of each data line 171 has two trenches 186 extending downward to the substrate 110.

As described above, the contact assistants 97 located at the contact holes 189 extend along the surfaces of the trenches 186 to have unevenness. The unevenness gives large friction to probe tips contacting the contact assistants 97 for gross test, thereby preventing sliding of the tips.

Figure 29:
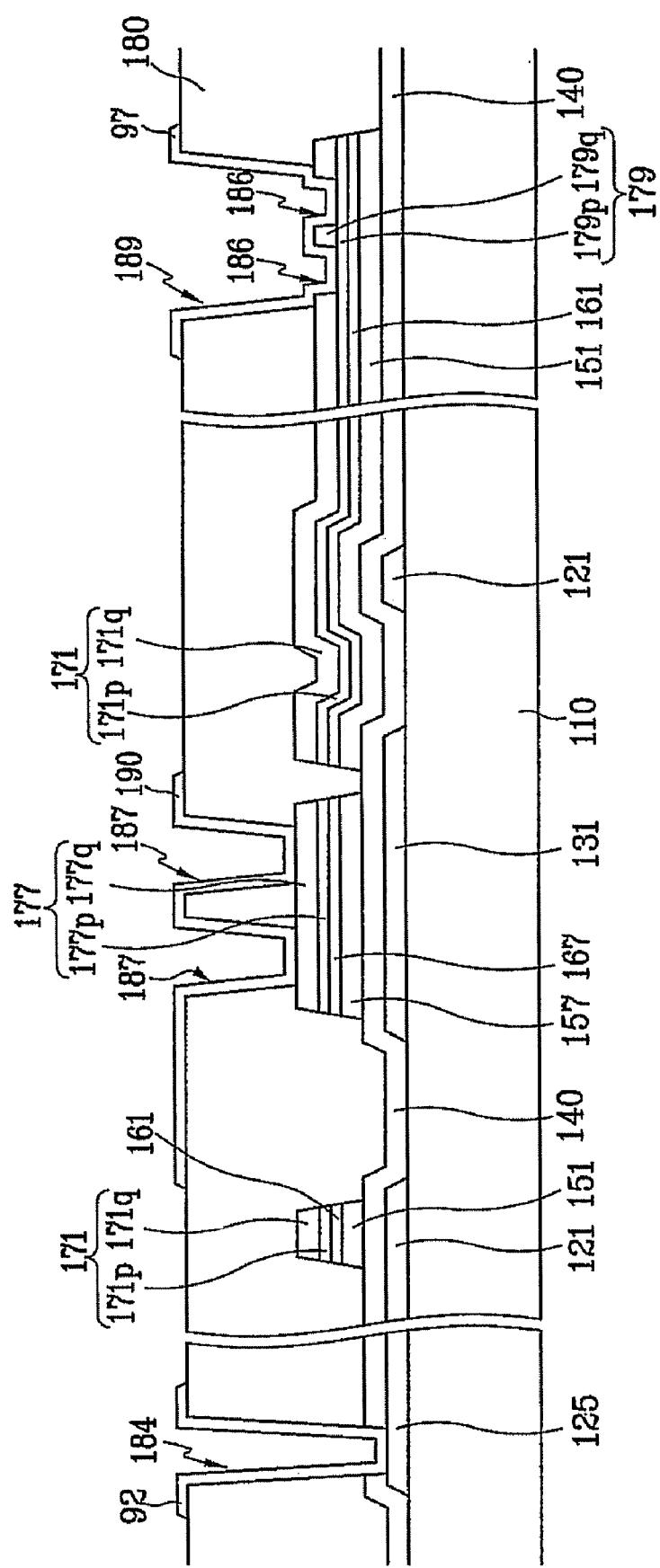
FIG. 29 is a sectional view of a TFT array panel according to another embodiment of the present invention.

FIG. 29 is a sectional view of the TFT array panel shown in FIG. 26 according to another embodiment of the present invention.

As shown in FIG. 29, a layered structure of a TFT array panel of an LCD according to this embodiment is almost the same as that shown in FIGS. 27 and 28. However, unlike the TFT array panel shown in FIGS. 27 and 28, the trenches 186 are provided only at the upper film 179q of the end portions 179 of the data lines 179.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of forming a contact structure of a semiconductor device, the method comprising:
    forming a lower conductive film;
    forming an upper conductive film on the lower conductive film, the upper conductive film including Al or Al alloy;
    forming a photoresist on the upper conductive film;
    wet-etching the upper conductive film using the photoresist as an etch mask to produce undercut under the photoresist;
    dry-etching the lower conductive film using the photoresist as an etch mask;
    forming an insulating layer having a contact hole exposing at least a portion of the lower conductive film; and
    forming an IZO layer on the insulating layer, the IZO layer contacting the lower conductive film through the contact hole.

2. The method of claim 1, wherein the contact hole exposes at least one edge of the lower conductive film.

3. The method of claim 1, wherein the lower conductive film comprises Cr.

4. A method of manufacturing a thin film transistor array panel, the method comprising:
    forming a gate conductive layer on an insulating substrate;
    forming a gate insulating layer on the gate conductive layer;
    forming a semiconductor layer on the gate insulating layer;
    forming a data conductive layer including a data line and a drain electrode on the gate insulating layer and the semiconductor layer;
    forming a protective layer having a contact hole on at least a portion of the gate conductive layer and the data conductive layer; and
    forming an IZO conductive layer connected to at least a portion of the gate conductive layer and the data conductive layer through the contact hole,
    wherein the at least a portion of the gate conductive layer and the data conductive layer includes a dry-etchable lower film and an upper film made of Al or Al alloy.

5. The method of claim 4, wherein the formation of the at least a portion of the gate conductive layer and the data conductive layer comprises:
    sequentially depositing the lower film and the upper film;
    forming a photoresist on the upper film;
    wet-etching the upper film; and
    dry-etching the lower film.

6. The method of claim 5, wherein the lower film comprises Cr.

7. The method of claim 6, wherein the lower film has a thickness equal to or less than about 500 Å.

8. The method of claim 4, wherein the semiconductor layer comprises an intrinsic film and an extrinsic film.

9. The method of claim 8, wherein the formation of the data conductive layer and the semiconductor layer is performed by etching with a single photoresist, and the photoresist comprises a first portion with a first thickness located on a wire area, a second portion with a second thickness smaller than the first thickness located on a channel area, and a third portion thinner than the second portion and located on a remaining area.

10. The method of claim 9, wherein the photoresist is formed by using a single mask.

11. The method of claim 10, wherein the formation of the gate insulating layer, the intrinsic film, the extrinsic film, and the data conductive layer comprises:
    sequentially depositing the gate insulating layer, an intrinsic amorphous silicon film, an extrinsic amorphous silicon film, a lower film and a upper film, which include first portions on the wire area, second portions on the channel area, and third portions on the remaining area;
    coating a photoresist on the conductor layer;
    exposing the photoresist to light through a mask;
    developing the photoresist;
    forming the data conductive layer, the extrinsic film, and the intrinsic film by removing the third portions of the upper film, the lower film, the extrinsic amorphous silicon film, and the intrinsic amorphous silicon film, and the second portions of the upper film, the lower film and the extrinsic amorphous silicon film; and
    removing the photoresist pattern.

12. The method of claim 10, wherein the formation of the data conductive layer, the extrinsic film, and the intrinsic film comprises:
    performing wet etching to remove the third portion of the upper film and to expose the third portion of the lower film;
    performing dry etching to remove the third portion of the lower film and to expose the third portion of the extrinsic amorphous silicon film;
    performing dry etching to remove the third portions of the extrinsic amorphous silicon film and the intrinsic amorphous silicon film and the second portion of the photoresist such that the second portion of the upper film is exposed and the intrinsic film is completed from the intrinsic amorphous silicon film;
    removing the second portion of the upper film;
    removing the second portion of the lower film such that the data conductive layer is completed;
    removing the second portion of the extrinsic amorphous silicon film such that the extrinsic film is completed; and
    removing the first portion of the photoresist.

13. The method of claim 12, wherein the removal of the first portion of the photoresist is performed between the removal of the second portion of the upper film and the removal of the second portion of the lower film.

* * * * *